(12) United States Patent
Harada et al.

(10) Patent No.: US 8,815,717 B2
(45) Date of Patent: Aug. 26, 2014

(54) VAPOR DEPOSITION METHOD AND VAPOR DEPOSITION APPARATUS

(75) Inventors: Yoshiyuki Harada, Tokyo (JP); Koichi Tachibana, Kanagawa-ken (JP); Toshiki Hikosaka, Tokyo (JP); Hajime Nago, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/875,835

(22) Filed: Sep. 3, 2010

(65) Prior Publication Data

US 2011/0143463 A1  Jun. 16, 2011

(30) Foreign Application Priority Data

Dec. 14, 2009 (JP) ................................. 2009-283352

(51) Int. Cl.
*H01L 21/20* (2006.01)
*H01L 21/36* (2006.01)

(52) U.S. Cl.
USPC ........................... 438/489; 438/503; 438/507

(58) Field of Classification Search
CPC ...................... H01L 21/02241; H01L 21/0226; H01L 21/02263; H01L 21/0228; H01L 21/02387; H01L 21/02389; H01L 21/02538; C30B 23/02; C30B 25/00; C30B 25/02; C30B 29/42; C30B 29/403; C30B 29/406
USPC ................. 118/708, 710, 712, 715, 716, 722; 438/16, 478, 488, 489, 493, 495, 503, 438/507
See application file for complete search history.

(56) References Cited

U.S. PATENT DOCUMENTS 5,665,214 A * 9/1997 Iturralde .................. 204/298.03
5,976,398 A * 11/1999 Yagi ....................... 252/62.3 GA (Continued)

FOREIGN PATENT DOCUMENTS

JP      9-181006      7/1997
JP     11-354456     12/1999

(Continued)

OTHER PUBLICATIONS

Japanese Office Action issued Apr. 23, 2012, in Japan Patent Application No. 2009-283352 (with English Translation).

(Continued)

*Primary Examiner* — Colleen Matthews
*Assistant Examiner* — Quovaunda V Jefferson
(74) *Attorney, Agent, or Firm* — Oblon, Spivak, McClelland, Maier & Neustadt, L.L.P.

(57) ABSTRACT

According to one embodiment, a vapor deposition method is disclosed for forming a nitride semiconductor layer on a substrate by supplying a group III source-material gas and a group V source-material gas. The method can deposit a first semiconductor layer including a nitride semiconductor having a compositional proportion of Al in group III elements of not less than 10 atomic percent by supplying the group III source-material gas from a first outlet and by supplying the group V source-material gas from a second outlet. The method can deposit a second semiconductor layer including a nitride semiconductor having a compositional proportion of Al in group III elements of less than 10 atomic percent by mixing the group III and group V source-material gases and supplying the mixed group III and group V source-material gases from at least one of the first outlet and the second outlet.

16 Claims, 8 Drawing Sheets

(56) References Cited

U.S. PATENT DOCUMENTS

| | | | |
|---|---|---|---|
| 2002/0167023 A1* | 11/2002 | Chavarkar et al. | 257/194 |
| 2004/0173150 A1* | 9/2004 | Derderian | 118/715 |
| 2006/0057824 A1* | 3/2006 | Araki et al. | 438/478 |
| 2008/0017099 A1 | 1/2008 | Onomura et al. | |

FOREIGN PATENT DOCUMENTS

| | | |
|---|---|---|
| JP | 2000-58458 | 2/2000 |
| JP | 2003-101151 A | 4/2003 |
| JP | 2005-93914 A | 4/2005 |
| JP | 2007-317770 | 12/2007 |

OTHER PUBLICATIONS

Office Action issued Apr. 26, 2013 in Japanese Patent Application No. 2012-132290 with English language translation.

* cited by examiner

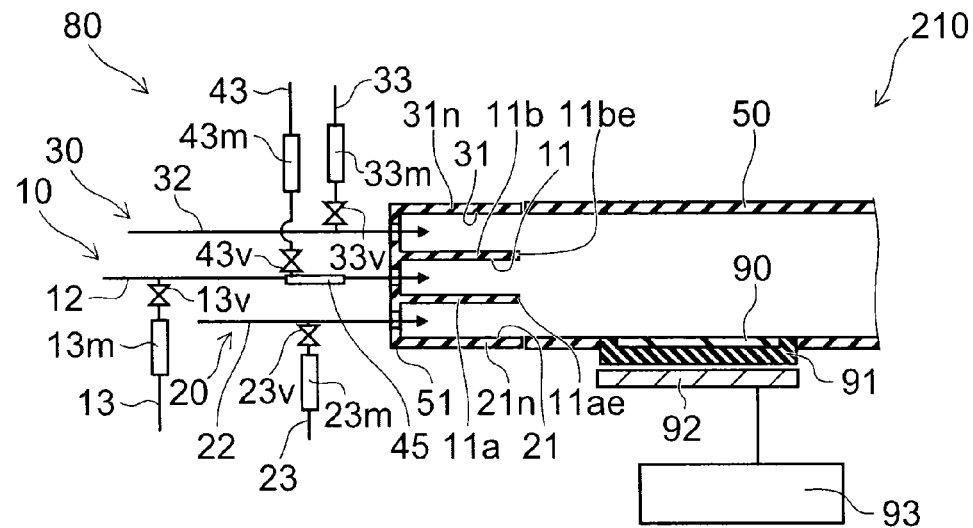
FIG. 3
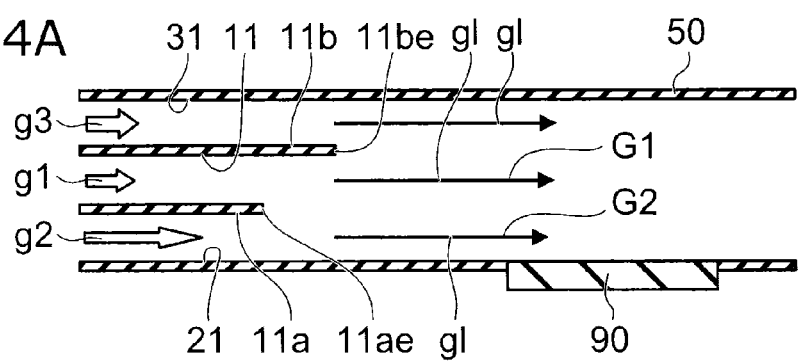
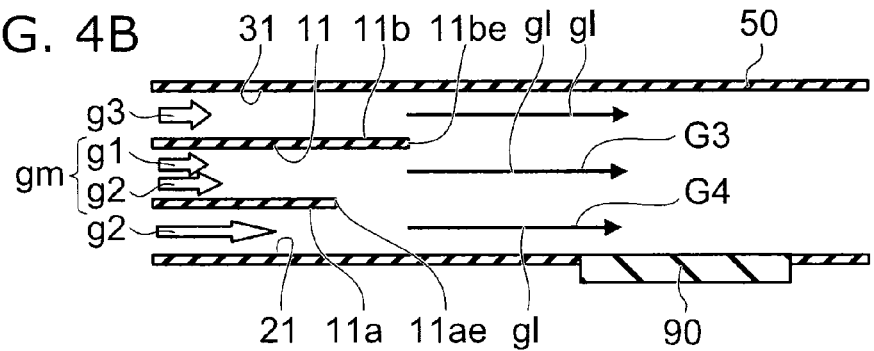

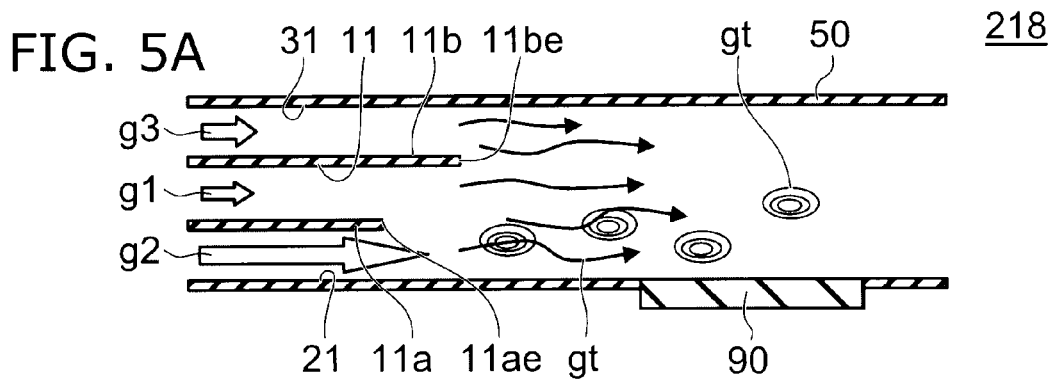
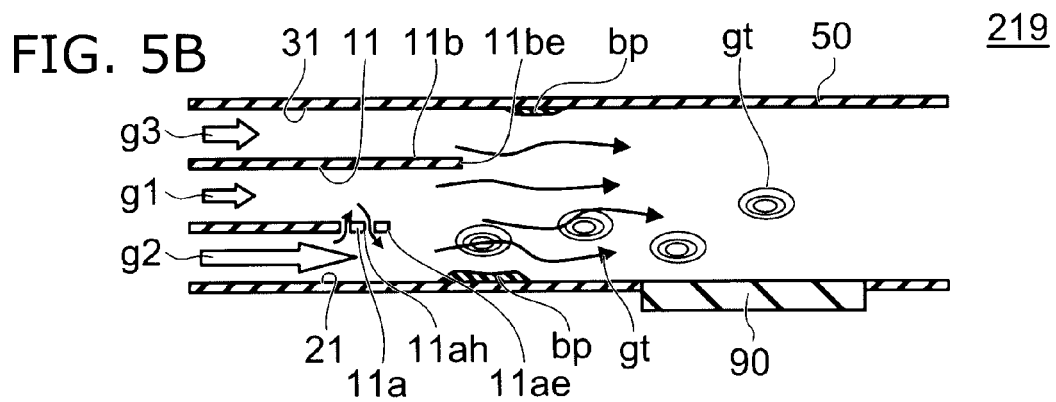
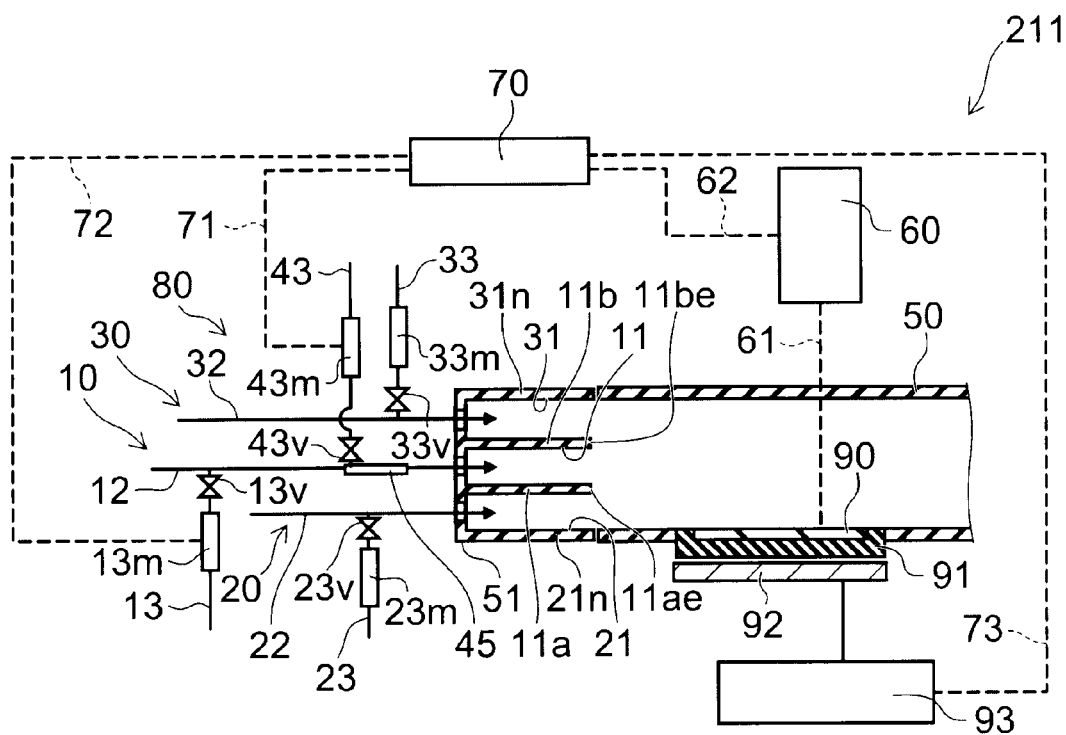
FIG. 6

US 8,815,717 B2

VAPOR DEPOSITION METHOD AND VAPOR DEPOSITION APPARATUS

CROSS-REFERENCE TO RELATED APPLICATIONS

This application is based upon and claims the benefit of priority from the prior Japanese Patent Application No. 2009-283352, filed on Dec. 14, 2009; the entire contents of which are incorporated herein by reference.

FIELD

Embodiments described herein relate generally to a vapor deposition method and a vapor deposition apparatus.

BACKGROUND

Nitride semiconductors such as AlGaN, InGaN, and the like, in which a portion of the group III element is replaced with Al, In, and the like, are used in semiconductor light emitting devices. In the case where a group III source-material gas and a group V source-material gas mix excessively in the apparatus when depositing AlGaN using metal organic chemical vapor deposition, reaction products that do not contribute to the growth on the substrate are produced; limitations on the Al composition occur; and the uniformity in the surface and reproducibility of the composition and film thickness decrease. Therefore, configurations have been employed to introduce the group III and group V source-material gases in a separated state up to the proximity of the substrate. For example, JP-A 11-354456 (Kokai) (1999) discusses technology in which a source-material gas including a group III source and a nitrogen source is introduced substantially parallel to the substrate surface and in a laminar configuration. Further, JP-A 2007-317770 (Kokai) discusses technology in which a through-hole is provided in a terminal portion of a partition of a vapor deposition apparatus to mix the source-material gases to provide a vapor phase reaction under more uniform conditions.

On the other hand, although it is desirable to increase the flow rate ratio of the group V source-material gas when depositing, for example, InGaN, increasing the flow rate ratio in a configuration in which the group III and group V source-material gases are introduced in a separated state up to the proximity of the substrate causes turbulent flow to occur and reduces the uniformity in the surface and the reproducibility. By conventional art, it is difficult to perform deposition with proper conditions for each semiconductor layer having a different composition.

BRIEF DESCRIPTION OF THE DRAWINGS

FIG. 3 is a schematic view showing a vapor deposition apparatus;
FIG. 4A and FIG. 4B are schematic views showing the vapor deposition method;
FIG. 5A and FIG. 5B are schematic views showing a vapor deposition method of a comparative example;
FIG. 6 is a schematic view showing a vapor deposition apparatus.

DETAILED DESCRIPTION

Figure 1:
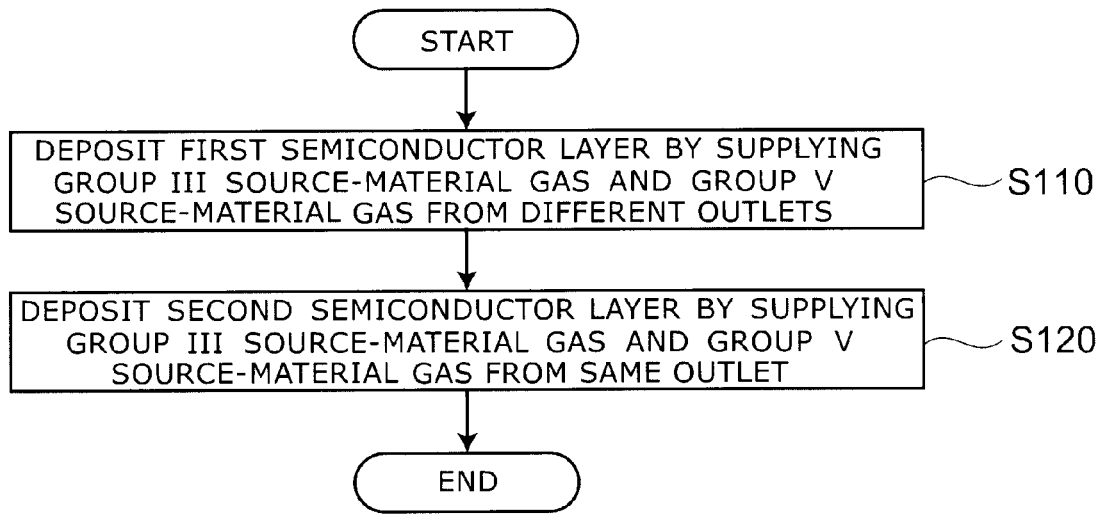
FIG. 1 is a flowchart showing a vapor deposition method.

In general, according to one embodiment, a vapor deposition method is disclosed for forming a nitride semiconductor layer on a substrate disposed in a reaction chamber by supplying a group III source-material gas and a group V source-material gas into the reaction chamber from a plurality of outlets. The method can deposit a first semiconductor layer including a nitride semiconductor having a compositional proportion of Al in group III elements of not less than 10 atomic percent by supplying the group III source-material gas toward the substrate from a first outlet and by supplying the group V source-material gas toward the substrate from a second outlet different from the first outlet. In addition, the method can deposit a second semiconductor layer including a nitride semiconductor having a compositional proportion of Al in group III elements of less than 10 atomic percent by mixing the group III source-material gas and the group V source-material gas and supplying the mixed group III and group V source-material gases toward the substrate from at least one of the first outlet and the second outlet.

According to another embodiment, a vapor deposition apparatus performs vapor deposition of a nitride semiconductor layer on a substrate using a group III source-material gas and a group V source-material gas. The apparatus includes a reaction chamber, a first gas supply unit, and a second gas supply unit. The substrate is disposed in the reaction chamber. The first gas supply unit communicates with the reaction chamber to supply one selected from the group III source-material gas and the group V source-material gas toward the substrate. The second gas supply unit communicates with the reaction chamber to supply the other one of the group III source-material gas and the group V source-material gas toward the substrate. At least one gas supply unit selected from the first gas supply unit and the second gas supply unit includes a mixing unit to mix the group III source-material gas and the group V source-material gas and supply the mixed group III and group V source-material gases toward the reaction chamber side of the at least one gas supply unit. The at least one gas supply unit further is capable of supplying the group III source-material gas and the group V source-material gas mixed by the mixing unit toward the substrate disposed in the reaction chamber.

Exemplary embodiments of the invention will now be described in detail with reference to the drawings.

The drawings are schematic or conceptual; and the relationships between the thickness and width of portions, the proportions of sizes among portions, etc., are not necessarily the same as the actual values thereof. Further, the dimensions and proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIG. 1 is a flowchart illustrating a vapor deposition method according to a first embodiment of the invention.

Figure 2:
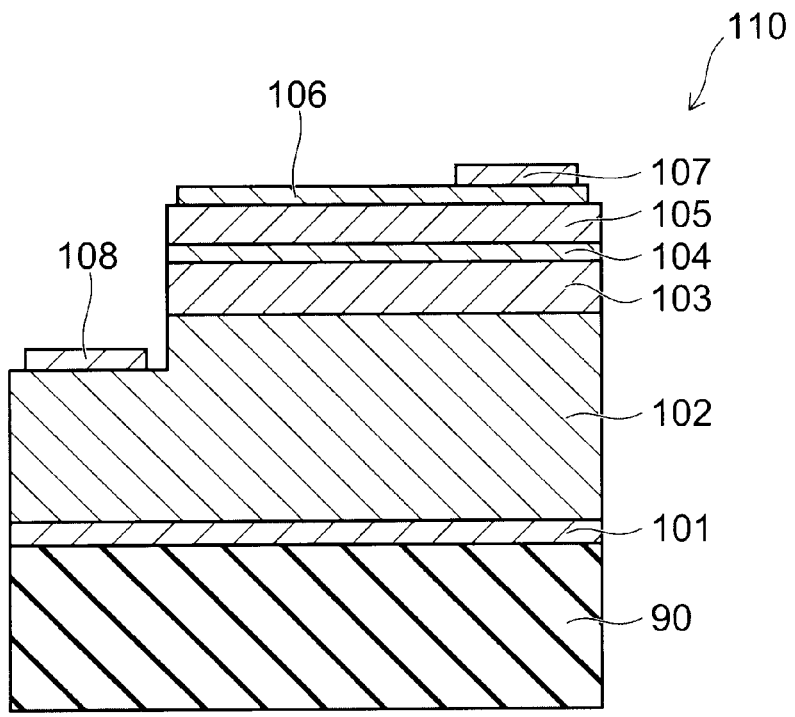
FIG. 2 is a schematic cross-sectional view showing a semiconductor light emitting device.

FIG. 2 is a schematic cross-sectional view illustrating the configuration of a semiconductor light emitting device manufactured using the vapor deposition method and a vapor deposition apparatus according to the first embodiment of the invention.

FIG. 3 is a schematic view illustrating the configuration of the vapor deposition apparatus according to the first embodiment of the invention.

First, an example of a semiconductor light emitting device manufactured using the vapor deposition method and the vapor deposition apparatus according to this embodiment of the invention will be described using FIG. 2. The semiconductor light emitting device may be, for example, a blue light emitting diode (LED), a white LED, a blue semiconductor laser (LD), a bluish-violet semiconductor LD, etc. The case is described hereinbelow where the semiconductor light emitting device is a blue LED.

As illustrated in FIG. 2, the semiconductor light emitting device 110 includes a stacked structural body including a buffer layer 101, an n-type contact layer 102, a light emitting layer 103, a p-type electron blocking layer 104, and a p-type contact layer 105 stacked sequentially on a substrate 90. The buffer layer 101 may include, for example, polycrystal GaN. The n-type contact layer 102 may include, for example, GaN doped with Si. The light emitting layer 103 may include, for example, a quantum well structure having a barrier layer and a well layer multiply stacked alternately. The barrier layer may include, for example, GaN. The well layer may include, for example, InGaN. The p-type electron blocking layer 104 may include, for example, AlGaN doped with Mg and having an Al composition of 15%. The p-type contact layer 105 may include GaN doped with Mg.

In the stacked structural body of the semiconductor light emitting device 110, a portion of the n-type contact layer 102 and portions of the light emitting layer 103, the p-type electron blocking layer 104, and the p-type contact layer 105 are removed to expose a portion of the n-type contact layer 102. The stacked structural body of the semiconductor light emitting device 110 further includes an n-side electrode 108 connected to the n-type contact layer 102, a p-side transparent electrode 106 connected to the p-type contact layer 105, and a p-side electrode 107 connected to the p-side transparent electrode 106.

Thus, generally, the stacked structural body included in the semiconductor light emitting device using the nitride semiconductor includes semiconductor layers of GaN and mixed crystals in which a portion of the group III element is replaced with Al, In, and the like, that is, AlGaN, InGaN, and AlInGaN. Metal organic chemical vapor deposition (MOCVD), for example, is used to form the stacked structural body of such a semiconductor light emitting device; and the types and flow rates of the source-material gases are controlled according to the composition of each of the semiconductor layers.

In the semiconductor light emitting device 110 recited above, the p-type electron blocking layer 104 (in the example recited above, AlGaN doped with Mg and having an Al composition of 15%) is a first semiconductor layer including a nitride semiconductor having a compositional proportion of Al in group III elements of not less than 10 atomic percent. The well layer (in the example recited above, InGaN) is a second semiconductor layer including a nitride semiconductor having a compositional proportion of Al in group III elements of less than 10 atomic percent.

Thus, the semiconductor light emitting device 110 includes a first semiconductor layer including a nitride semiconductor having a compositional proportion of Al in group III elements of not less than 10 atomic percent and a second semiconductor layer including a nitride semiconductor having a compositional proportion of Al in group III elements of less than 10 atomic percent.

Thus, the vapor deposition apparatus according to this embodiment may be used when depositing the first and second semiconductor layers having different Al compositions on the substrate 90. The vapor deposition apparatus is a vapor deposition apparatus that performs vapor deposition of nitride semiconductor layers on the substrate 90 using a group III source-material gas and a group V source-material gas.

As illustrated in FIG. 3, the vapor deposition apparatus 210 according to this embodiment includes a reaction chamber 50 (e.g., a flow channel) in which the substrate 90 is disposed, a first gas supply unit 10, and a second gas supply unit 20. A third gas supply unit 30 also may be included.

The first gas supply unit 10 communicates with the reaction chamber 50 and switches between a first operation and a second operation. The first operation supplies one selected from the group III source-material gas and the group V source-material gas toward the substrate 90 disposed in the reaction chamber 50. The second operation mixes the group III source-material gas and the group V source-material gas and supplies the mixed group III and group V source-material gases toward the substrate 90 disposed in the reaction chamber 50.

Herein, the one gas selected from the group III source-material gas and the group V source-material gas is taken as a first source-material gas. The other gas of the group III source-material gas and the group V source-material gas is taken as a second source-material gas. The case is described hereinbelow where the first source-material gas is the group III source-material gas and the second source-material gas is the group V source-material gas.

The second gas supply unit 20 communicates with the reaction chamber 50 to supply the other one of the group III source-material gas and the group V source-material gas (the second source-material gas, i.e., the group V source-material gas) toward the substrate 90 disposed in the reaction chamber 50.

Thus, the first gas supply unit 10 is operational in an operation mode of supplying the first source-material gas toward the substrate 90 and an operation mode of supplying the mixed first and second source-material gases toward the substrate 90 disposed in the reaction chamber 50. On the other hand, the second gas supply unit 20 supplies the second source-material gas.

The third gas supply unit 30 may communicate with the reaction chamber 50 to supply a gas toward the substrate 90 as a sub-flow to straighten the flow of the gases.

The specific configuration of the vapor deposition apparatus 210 will now be described further.

The vapor deposition apparatus 210 is an example having a horizontal reaction chamber. The reaction chamber 50 is a flow channel having a cylindrical configuration with, for example, a rectangular cross section. The axis of the cylinder of the reaction chamber 50 is disposed, for example, horizontally. Flow paths of the source-material gases form in the reaction chamber 50. A susceptor 91 (a placement unit) is provided on the bottom face side of the reaction chamber 50; and the substrate 90 on which vapor deposition is performed is placed on the upper face of the susceptor 91. The substrate 90 may rotate with the rotation of the susceptor 91.

A heater 92 is provided on the lower side of the susceptor 91; and the heater 92 heats the substrate 90 via the susceptor 91. The heater 92 may be controlled by a heater control unit 93.

The source-material gas described below is introduced from a gas introduction unit 51 at one side-face end of the reaction chamber 50; the source-material gas flows toward the substrate 90 in a direction, for example, parallel to the surface of the substrate 90; and the source-material gas after the reaction is discharged from a gas exhaust unit (not illustrated) provided on the side of the reaction chamber 50 opposite to the gas introduction unit 51.

In this specific example, the gas introduction unit 51 is subdivided into three portions by partitions. Namely, a second gas introduction unit 21, a first gas introduction unit 11, and a third gas introduction unit 31 are provided in this order from the lower side, i.e., the susceptor 91 side. A first partition 11*a* is provided between the first gas introduction unit 11 and the second gas introduction unit 21; and a second partition 11*b* is provided between the first gas introduction unit 11 and the third gas introduction unit 31.

The first gas introduction unit 11 encloses the space between the first partition 11*a* and the second partition 11*b*. Gas is supplied from the first gas introduction unit 11 toward the substrate 90. The second gas introduction unit 21 encloses the space between the first partition 11*a* and a second gas introduction unit wall 21*n*. Gas is supplied from the second gas introduction unit 21 toward the substrate 90. The third gas introduction unit 31 encloses the space between the second partition 11*b* and a third gas introduction unit wall 31*n*. Gas is supplied from the third gas introduction unit 31 toward the substrate 90. In other words, the first gas supply unit 10 and the second gas supply unit 20 are divided from each other by a partition (the first partition 11*a*). The first gas supply unit 10 and the third gas supply unit 30 are divided from each other by a partition (the second partition 11*b*).

An end portion 11*ae* of the first partition 11*a* is proximal to the susceptor 91; and the end portions of the first gas introduction unit 11 and the second gas introduction unit 21 are proximal to the substrate 90. Thereby, the gas supplied from the first gas introduction unit 11 and the gas supplied from the second gas introduction unit 21 are introduced toward the substrate 90 in a state in which the gases are in a laminar configuration and are separated moderately without being excessively mixed with each other.

An end portion 11*be* of the second partition 11*b* is proximal to the susceptor 91; and the end portions of the first gas introduction unit 11 and the third gas introduction unit 31 are proximal to the substrate 90. Thereby, the gas supplied from the first gas introduction unit 11 and the gas supplied from the third gas introduction unit 31 are introduced toward the substrate 90 in a state in which the gases are in a laminar configuration and are separated moderately without being excessively mixed with each other.

Although the position along the gas introduction direction of the end portion 11*ae* of the first partition 11*a* is the same as the position along the gas introduction direction of the end portion 11*be* of the second partition 11*b* in the specific example illustrated in FIG. 3, the relationship between the position of the end portion 11*ae* of the first partition 11*a* and the position of the end portion 11*be* of the second partition 11*b* is arbitrary. For example, the position along the gas introduction direction of the end portion 11*be* of the second partition 11*b* may be more proximal to the substrate 90 than is the position along the gas introduction direction of the end portion 11*ae* of the first partition 11*a*.

A second pipe 22 is connected to the second gas introduction unit 21. At least one selected from hydrogen gas and nitrogen gas, for example, is introduced to the second pipe 22 via, for example, a not-illustrated valve and a not-illustrated mass flow controller. Thereby, the at least one selected from hydrogen gas and nitrogen gas is introduced to the second gas introduction unit 21 with a controlled flow rate.

A second source-material gas pipe 23 is connected to the second pipe 22 via a second valve 23*v* and a second mass flow controller 23*m*. An $NH_3$ gas cylinder, for example, is connected to the side of the second source-material gas pipe 23 opposite to the second mass flow controller 23*m*. In other words, the group V source-material gas of $NH_3$ gas, i.e., the second source-material gas, is supplied to the second source-material gas pipe 23. Thereby, the second source-material gas (in this example, the group V source-material gas), i.e., $NH_3$ gas, is supplied to the second gas introduction unit 21 with a controlled flow rate.

On the other hand, a first pipe 12 is connected to the first gas introduction unit 11. At least one selected from hydrogen gas and nitrogen gas, for example, is introduced to the first pipe 12 via, for example, a not-illustrated valve and a not-illustrated mass flow controller. Thereby, the at least one selected from hydrogen gas and nitrogen gas is introduced to the first gas introduction unit 11 with a controlled flow rate.

A first source-material gas pipe 13 is connected to the first pipe 12 via a first valve 13*v* and a first mass flow controller 13*m*. A pipe is connected to the side of the first source-material gas pipe 13 opposite to the first mass flow controller 13*m* to introduce, for example, the group III source-material gas of a metal-organic gas, i.e., the first source-material gas. In other words, the group III source-material gas of a metal-organic gas, i.e., the first source-material gas, is supplied to the first source-material gas pipe 13.

Also, a second source-material gas pipe 43 for mixing is connected to the first pipe 12 via a mixing gas valve 43*v* and a mixing gas mass flow controller 43*m*. The position where the second source-material gas pipe 43 for mixing is connected to the first pipe 12 is downstream from the position where the first source-material gas pipe 13 is connected to the first pipe 12. In other words, the second source-material gas pipe 43 for mixing is connected to the first pipe 12 between the first source-material gas pipe 13 and the first gas introduction unit 11. An external mixing unit 45 (the mixing unit) is provided in the first pipe 12 between the second source-material gas pipe 43 for mixing and the first gas introduction unit 11.

Thus, the vapor deposition apparatus 210 is a vapor deposition apparatus performing vapor deposition of a nitride semiconductor layer on the substrate 90 using a group III source-material gas and a group V source-material gas, the apparatus including: the reaction chamber 50 in which the substrate 90 is disposed; the first gas supply unit 10 communicating with the reaction chamber 50 to supply one selected from the group III source-material gas and the group V source-material gas toward the substrate; and the second gas supply unit 20 communicating with the reaction chamber 50 to supply the other one of the group III source-material gas and the group V source-material gas toward the substrate 90.

At least one gas supply unit selected from the first gas supply unit 10 and the second gas supply unit 20 (in this specific example, the first gas supply unit 10) includes a mixing unit (in this specific example, the external mixing unit 45) that mixes the group III source-material gas and the group V source-material gas and supplies the mixed group III and group V source-material gases toward the reaction chamber 50 side of the at least one gas supply unit recited above (in this specific example, the first gas supply unit 10). The at least one gas supply unit recited above (in this specific example, the first gas supply unit 10) further is capable of supplying the group III source-material gas and the group V source-material gas mixed by the mixing unit toward the substrate 90 disposed in the reaction chamber 50.

In this specific example, the mixing unit recited above (the external mixing unit 45) is provided in the first gas supply unit 10. The first gas supply unit 10 further includes the first pipe 12 introducing the at least one selected from the group III source-material gas and the group V source-material gas (in this case, the group III source-material gas). The mixing unit (the external mixing unit 45) is provided between the first pipe and the reaction chamber 50. A pipe (the second source-material gas pipe 43 for mixing) is connected to the mixing unit (the external mixing unit 45) on the first pipe 12 side to introduce the other one of the group III source-material gas and the group V source-material gas (in this case, the group V source-material gas).

The first source-material gas is introduced to the first gas introduction unit 11 in the case where the second source-material gas is not introduced from the second source-material gas pipe 43 for mixing to the first pipe 12 and the first source-material gas is introduced from the first source-material gas pipe 13 to the first pipe 12. In other words, the group III source-material gas is introduced from the first gas introduction unit 11. By introducing the group V source-material gas from the second gas introduction unit 21 at this time, the group III source-material gas and the group V source-material gas can be supplied from different outlets (the first gas introduction unit 11 and the second gas introduction unit 21).

In the case where the second source-material gas is introduced to the first pipe 12 from the second source-material gas pipe 43 for mixing while introducing the first source-material gas from the first source-material gas pipe 13 to the first pipe 12, the first source-material gas and the second source-material gas are mixed in the external mixing unit 45; and the mixed first and second source-material gases are introduced to the first gas introduction unit 11. In other words, the group III source-material gas and the group V source-material gas are supplied from the same outlet (the first gas introduction unit 11). At this time, the second source-material gas (the group V source-material gas) may be introduced from the second gas introduction unit 21. Thereby, the flow rate ratio of the group V source-material gas can be increased.

The first gas supply unit 10 includes the mixing unit (the external mixing unit 45) that mixes the group III source-material gas and the group V source-material gas and supplies the mixed group III and group V source-material gases toward the reaction chamber 50 side of the first gas supply unit 10. The first gas supply unit 10 further is capable of supplying the group III source-material gas and the group V source-material gas mixed by the mixing unit toward the substrate 90 disposed in the reaction chamber 50.

Thereby, in the vapor deposition apparatus 210 of this specific example, two different operations can be implemented, that is, the operation of introducing the first source-material gas (e.g., the group III source-material gas) to the first gas introduction unit 11 and the operation of introducing the mixed first source-material gas (e.g., the group III source-material gas) and second source-material gas (e.g., the group V source-material gas) to the first gas introduction unit 11.

The external mixing unit 45 may have, for example, a chamber structure having a cross-sectional area larger than that of the first pipe 12. Thereby, the efficiency of the mixing of the first source-material gas and the second source-material gas increases. However, the invention is not limited thereto. The configuration of the external mixing unit 45 is arbitrary. For example, sufficient effects of the mixing can be obtained even in the case where a pipe having the same diameter as the first pipe 12 is used as the external mixing unit 45.

A third pipe 32 is connected to the third gas introduction unit 31. At least one selected from hydrogen gas and nitrogen gas, for example, is introduced to the third pipe 32 via, for example, a not-illustrated valve and a not-illustrated mass flow controller. Thereby, the at least one selected from hydrogen gas and nitrogen gas is introduced to the third gas introduction unit 31 with a controlled flow rate.

A third source-material gas pipe 33 is connected to the third pipe 32 via a third valve 33v and a third mass flow controller 33m. In this specific example, an $NH_3$ gas cylinder, for example, is connected to the side of the third source-material gas pipe 33 opposite to the third mass flow controller 33m. In other words, the group V source-material gas of the $NH_3$ gas is supplied to the third source-material gas pipe 33. Thereby, the second source-material gas (in this example, the group V source-material gas), i.e., the $NH_3$ gas, can be supplied with a controlled flow rate also to the third gas introduction unit 31.

In the vapor deposition apparatus 210, two operations can be implemented, that is, the operation of introducing the first source-material gas (e.g., the group III source-material gas) to the first gas introduction unit 11 and the operation of introducing the mixed first source-material gas (e.g., the group III source-material gas) and second source-material gas (e.g., the group V source-material gas) to the first gas introduction unit 11. Therefore, nitride semiconductor layers can be deposited by selectively using the two operations.

In other words, the vapor deposition apparatus 210 includes: the reaction chamber 50 in which the substrate 90 is disposed; and a gas supply unit 80 that performs the operation of supplying the group III source-material gas and the group V source-material gas toward the substrate 90 disposed in the reaction chamber 50 from mutually different outlets to deposit the first semiconductor layer including a nitride semiconductor having a compositional proportion of Al in group III elements of not less than 10 atomic percent and the operation of mixing the group III source-material gas and the group V source-material gas and supplying the mixed group III and group V source-material gases toward the substrate 90 from same outlet to deposit the second semiconductor layer including a nitride semiconductor having a compositional proportion of Al in group III elements of less than 10 atomic percent.

Herein, the gas supply unit 80 includes the first gas supply unit 10 and the second gas supply unit 20.

The first gas supply unit 10 includes the first gas introduction unit 11, the first pipe 12, the first valve 13v, the first mass flow controller 13m, the first source-material gas pipe 13, the external mixing unit 45, the mixing gas valve 43v, the mixing gas mass flow controller 43m, and the second source-material gas pipe 43 for mixing.

The second gas supply unit 20 includes the second gas introduction unit 21, the second pipe 22, the second valve 23v, the second mass flow controller 23m, and the second source-material gas pipe 23.

In other words, for example, the gas supply unit 80 may include: the first gas supply unit 10 communicating with the reaction chamber 50 and switching between the first operation of supplying at least one selected from the group III source-material gas and the group V source-material gas (e.g., the group III source-material gas) toward the substrate 90 disposed in the reaction chamber 50 and the second operation of mixing the group III source-material gas and the group V source-material gas and supplying the mixed group III and group V source-material gases toward the substrate 90 disposed in the reaction chamber 50; and the second gas supply unit 20 communicating with the reaction chamber 50 to supply the other one of the group III source-material gas and the group V source-material gas (e.g., the group V source-material gas) toward the substrate 90 disposed in the reaction chamber 50.

The gas supply unit 80 may further include the third gas supply unit 30.

The third gas supply unit 30 includes the third gas introduction unit 31, the third pipe 32, the third valve 33v, the third mass flow controller 33m, and the third source-material gas pipe 33.

By using such a vapor deposition apparatus 210, for example, the vapor deposition method according to this embodiment can be implemented.

In other words, as illustrated in FIG. 1, the vapor deposition method according to this embodiment is a vapor deposition method forming a nitride semiconductor layer on the substrate 90 disposed in the reaction chamber 50 by supplying the group III source-material gas and the group V source-material gas into the reaction chamber 50 from multiple outlets of gas supply pipes, the multiple outlets being provided in the reaction chamber, the method including: depositing the first semiconductor layer (e.g., the p-type electron blocking layer 104) including a nitride semiconductor having a compositional proportion of Al in group III elements of not less than 10 atomic percent by supplying the group III source-material gas and the group V source-material gas toward the substrate 90 from mutually different outlets (e.g., the first gas introduction unit 11 and the second gas introduction unit 21) (step S110); and depositing the second semiconductor layer (e.g., a well layer of InGaN) including a nitride semiconductor having a compositional proportion of Al in group III elements of less than 10 atomic percent by mixing the group III source-material gas and the group V source-material gas and supplying the mixed group III and group V source-material gases toward the substrate 90 from the same outlet (e.g., the first gas introduction unit 11) (step S120).

Then, when depositing the second semiconductor layer (step S120), one selected from the group III source-material gas and the group V source-material gas (e.g., the group V source-material gas) can be further supplied toward the substrate 90 from an outlet (e.g., the second gas introduction unit 21) different from the outlet of the mixed group III and group V source-material gases recited above (the first gas introduction unit 11). Thereby, for example, the flow rate ratio of the second source-material gas (e.g., the group V source-material gas of NH$_3$ gas) to the total flow rate can be increased.

However, the invention is not limited thereto. In step S120, one selected from the group III source-material gas and the group V source-material gas (e.g., the group V source-material gas) also may be supplied toward the substrate 90 from an outlet other than the two outlets used in step S110 (the first gas introduction unit 11 and the second gas introduction unit 21) while mixing the group III source-material gas and the group V source-material gas and supplying the mixed group III and group V source-material gases from the outlet of the mixed group III and group V source-material gases (e.g., the first gas introduction unit 11).

An example is described hereinbelow in which the group III source-material gas and the group V source-material gas are supplied from different outlets, i.e., the first gas introduction unit 11 and the second gas introduction unit 21, respectively, in step S110 and the group V source-material gas is supplied from the second gas introduction unit 21 while mixing the group III source-material gas and the group V source-material gas and supplying the mixed group III and group V source-material gases from the same outlet, i.e., the first gas introduction unit 11, in step S120.

FIGS. 4A and 4B are schematic views illustrating the vapor deposition method according to this embodiment of the invention.

Namely, FIG. 4A corresponds to the depositing of the first semiconductor layer including a nitride semiconductor having an Al compositional proportion of not less than 10 atomic percent (step S110); and FIG. 4B corresponds to the depositing of the second semiconductor layer including a nitride semiconductor having an Al compositional proportion of less than 10 atomic percent (step S120).

When depositing the first semiconductor layer as illustrated in FIG. 4A, a first source-material gas g1 (a first gas flow G1) is supplied from the first gas introduction unit 11 toward the substrate 90. The first source-material gas g1 may include, for example, a group III source-material gas, e.g., trimethylaluminium (TMA).

A second source-material gas g2 (a second gas flow G2) is supplied from the second gas introduction unit 21 toward the substrate 90. The second source-material gas g2 may include the group V source-material gas of ammonia (NH$_3$).

The third source-material gas g3 is supplied from the third gas introduction unit 31 toward the substrate 90. The third source-material gas g3 may include, for example, N$_2$. The third source-material gas g3 flows toward the substrate 90 as a sub-flow to straighten the flow of the gases.

Because the first partition 11a is provided between the first gas introduction unit 11 and the second gas introduction unit 21, the first source-material gas g1 and the second source-material gas g2 are separated from each other up to the end portion 11ae of the first partition 11a. The first source-material gas g1 and the second source-material gas g2 are substantially maintained in a separated state even after exiting from the first gas introduction unit 11 and the second gas introduction unit 21, respectively, and reach the substrate 90 as a laminar flow gl. Therefore, reaction products do not easily adhere on unnecessary portions other than the upper face of the substrate 90. Therefore, the control range of the Al composition is wide for the first semiconductor layer being deposited; and a semiconductor layer having any Al composition is obtained easily. Because the source-material gases reach the substrate 90 as the laminar flow gl, the uniformity in the surface of the composition of the first semiconductor layer is high and the uniformity in the surface of the film thickness of the first semiconductor layer is high. Also, the reproducibility of the composition of the first semiconductor layer is high and the reproducibility of the film thickness of the first semiconductor layer is high.

On the other hand, when depositing the second semiconductor layer as illustrated in FIG. 4B, the first source-material gas g1 and the second source-material gas g2 are mixed (into a third gas flow G3) and supplied toward the substrate 90 from the first gas introduction unit 11. At this time, the first source-material gas g1 may include, for example, a group III source-material gas, e.g., trimethylindium (TMI). The second source-material gas g2 may include the group V source-material gas of NH$_3$. In other words, a gas mixture gm of the group III source-material gas of TMI and the group V source-material gas of NH$_3$ is supplied from the first gas introduction unit 11 toward the substrate 90.

The group V source-material gas of NH$_3$ gas is supplied as the second source-material gas g2 (a fourth gas flow G4) from the second gas introduction unit 21.

The third source-material gas g3 (e.g., N$_2$) is supplied from the third gas introduction unit 31. In such a case as well, the third source-material gas g3 flows toward the substrate 90 as a sub-flow to straighten the flow of the gases.

From the viewpoint of the crystallinity and the deposition efficiency of the second semiconductor layer when depositing the second semiconductor layer having the low Al compositional proportion, it is desirable to increase the flow rate ratio of the NH$_3$ gas to the total flow rate. In the vapor deposition method and the vapor deposition apparatus 210 according to this embodiment, the gas mixture gm of TMI and NH$_3$ can be supplied from the first gas introduction unit 11 while supplying NH$_3$ from the second gas introduction unit 21. Therefore, it is easy to increase the ratio of NH$_3$ to the entirety. For example, although turbulent flow may occur in the case where the flow rate of the NH$_3$ supplied from the second gas introduction unit 21 is higher than those of the other gas introduction units, the occurrence of turbulent flow can be suppressed by limiting the flow rate of the NH$_3$ supplied from the second gas introduction unit 21 to about the same rate as those of the other gas introduction units at which turbulent flow does not occur and by supplying the gas mixture gm of TMI and NH$_3$ from the first gas introduction unit 11; and the flow rate ratio of the NH$_3$ gas to the total flow rate can be increased while maintaining the laminar flow gl.

Thereby, the second semiconductor layer having a low Al compositional proportion can be deposited with a high flow rate ratio of NH$_3$ gas; the uniformity in the surface of the composition and film thickness of the second semiconductor layer can be increased; and the reproducibility of the composition and film thickness of the second semiconductor layer can be increased.

Thus, according to the vapor deposition method according to this embodiment and the vapor deposition apparatus 210 according to this embodiment, semiconductor layers having different compositions can be formed with high uniformity in the surface and high reproducibility.

FIGS. 5A and 5B are schematic views illustrating a vapor deposition method of a comparative example.

In the vapor deposition apparatus 218 of the first comparative example as illustrated in FIG. 5A, the first gas introduction unit 11 supplies the first source-material gas (e.g., TMA and TMI); and the second gas introduction unit 21 introduces the second source-material gas (NH$_3$). The method of the first comparative example corresponds to the method discussed in JP-A 11-354456 (Kokai) (1999). When depositing the first semiconductor layer having the high Al compositional proportion, the production of unnecessary reaction products can be suppressed and the first semiconductor layer can be deposited similarly to the vapor deposition apparatus according to this embodiment as described in regard to FIG. 4A.

However, in the vapor deposition apparatus 218 of the first comparative example, a turbulent flow gt occurs when the flow rate of the NH$_3$ is increased to deposit the second semiconductor layer having the low Al compositional proportion. In other words, for example, the turbulent flow gt occurs in the interior of the reaction chamber 50 due to the difference between the flow velocity at the outlet of the second gas introduction unit 21 supplying the NH$_3$ and the flow velocity at the outlet of the first gas introduction unit 11. For example, the turbulent flow gt occurs in the case where the flow rate of the second gas introduction unit 21 is not less than 0.5 times the flow rate of the entirety.

In the case where the turbulent flow gt occurs, a concentration distribution of the source-material gases occurs at the surface of the substrate 90. As a result, unevenness in the surface of the composition and film thickness of the second semiconductor layer being deposited occur. Further, the reproducibility of the composition and film thickness decreases. Moreover, the inner wall faces of the reaction chamber 50 are heated together with the substrate 90; and reaction products easily adhere to portions thereof. The degree and history of adhesion of the reaction products change the thermal environment proximal to the substrate; and the reproducibility of the semiconductor layer being deposited decreases. In the case where reaction products are produced in locations other than the desired location, the utilization efficiency of materials decreases and maintenance of the vapor deposition apparatus also becomes difficult.

In a vapor deposition apparatus 219 of a second comparative example as illustrated in FIG. 5B, a through-hole 11ah is provided in the first partition 11a proximal to the end portion 11ae of the first partition 11a between the first gas introduction unit 11 and the second gas introduction unit 21. The apparatus of the second comparative example corresponds to the apparatus discussed in JP-A 2007-317770 (Kokai). In such a case, the first source-material gas g1 and the second source-material gas g2 mix with each other in stages proximally to the end portions of the first gas introduction unit 11 and the second gas introduction unit 21. Thereby, the composition and the film thickness of the semiconductor layer deposited on the substrate 90 may be uniform in the surface of the substrate 90.

However, the configuration of the through-hole 11ah is the same when depositing the first semiconductor layer having the high Al compositional proportion and when depositing the second semiconductor layer having the low Al compositional proportion. Therefore, it is difficult to deposit the first semiconductor layer and the second semiconductor layer with optimal conditions for both. For example, in the case where the through-hole 11ah is designed to provide optimal conditions for depositing the first semiconductor layer, the through-hole 11ah does not provide the optimal conditions for depositing the second semiconductor layer.

In the vapor deposition apparatus 219 in which the through-hole 11ah is provided, the first source-material gas g1 and the second source-material gas g2 are mixed continuously by the through-hole 11ah. In the case where the first semiconductor layer having the high Al compositional proportion is deposited in the state in which the first source-material gas g1 and the second source-material gas g2 are mixed continuously, a reaction product by is produced easily at locations other than the substrate 90. In the case where the second semiconductor layer having the low Al compositional proportion is deposited in the state in which the first source-material gas g1 and the second source-material gas g2 are mixed continuously, it is necessary to increase the flow rate of the second source-material gas (e.g., the NH$_3$) supplied from the second gas introduction unit 21; and the turbulent flow gt occurs easily. Thus, in the vapor deposition apparatus 219 of the second comparative example as well, it is difficult to deposit the first semiconductor layer and the second semiconductor layer with proper conditions for both.

Conversely, in the vapor deposition method and the vapor deposition apparatus 210 according to this embodiment, the first source-material gas and the second source-material gas are supplied toward the substrate 90 in a separated state when depositing the first semiconductor layer having the high Al compositional proportion. Thereby, the laminar flow gl can be realized when depositing the first semiconductor layer. Then, when depositing the second semiconductor layer having the low Al compositional proportion, the gas mixture gm of the first source-material gas and the second source-material gas can be supplied from the first gas introduction unit 11 while supplying the second source-material gas from the second gas introduction unit 21. Therefore, the occurrence of turbulent flow can be suppressed by supplying the second source-material gas from the second gas introduction unit 21 with a relatively low flow rate at which turbulent flow does not occur and by supplying the gas mixture gm of the first source-material gas and the second source-material gas from the first gas introduction unit 11; and the flow rate ratio of the $NH_3$ gas to the total flow rate can be increased while maintaining the laminar flow gl. In other words, the laminar flow gl can be realized when depositing the first semiconductor layer and when depositing the second semiconductor layer.

In the vapor deposition method and the vapor deposition apparatus 210 according to this embodiment, the group III source-material gas and the group V source-material gas are supplied in a separated state up to the end portion 11ae of the first partition 11a when depositing the first semiconductor layer having the high Al compositional proportion (step S110). When depositing the second semiconductor layer having the low Al compositional proportion (step S120), the group III source-material gas and the group V source-material gas are mixed upstream (the direction opposite to the direction toward the substrate 90) from the end portion 11ae of the first partition 11a. Thus, step S110 and step S120 use two types of states, that is, the state in which the source-material gases are separated up to the end portion of the first gas introduction unit 11 and the end portion of the second gas introduction unit 21 and the state in which the source-material gases are mixed prior to the end portions of the first gas introduction unit 11 and the second gas introduction unit 21.

Conversely, in the first comparative example, the source-material gases are separated up to the end portion of the first gas introduction unit 11 and the end portion of the second gas introduction unit 21 in all states. On the other hand, in the second comparative example, the source-material gases are mixed prior to the end portions of the first gas introduction unit 11 and the second gas introduction unit 21 in all states.

Thus, in this embodiment, the two types of states recited above are realized.

Thereby, when depositing the first semiconductor layer having the high Al compositional proportion (step S110), the vapor phase reaction of TMA and $NH_3$ can be suppressed by introducing the group III source-material gas and the group V source-material gas toward the substrate 90 in the reaction chamber 50 in a separated state up to the proximity of the substrate 90. Therefore, the substrate uniformity in the surface and reproducibility of the compositional proportion and film thickness of the first semiconductor layer can be ensured.

Further, when depositing the second semiconductor layer having a low Al compositional proportion, e.g., a second semiconductor layer not including Al (e.g., a semiconductor layer including In) (step S120), the turbulent flow gt is suppressed and the laminar flow gl is maintained by increasing the flow rate ratio of the $NH_3$ to the total flow rate, mixing the group III source-material gas and the group V source-material gas, and supplying the mixed group III and group V source-material gases toward the substrate 90. Thereby, the substrate uniformity in the surface and reproducibility of the compositional proportion and film thickness of the second semiconductor layer can be ensured.

By using the vapor deposition apparatus 210 according to this embodiment, step S110 and step S120 recited above can be executed as a series of operations. Therefore, the substrate uniformity in the surface and reproducibility can be ensured simultaneously for both the first semiconductor layer and the second semiconductor layer; and it is possible to manufacture a light emitting device having excellent characteristics with high yield.

Thus, the uniformity in the surface of the compositional proportion and film thickness can be increased for both the first semiconductor layer and the second semiconductor layer.

Further, the production of reaction products can be suppressed for portions other than the substrate 90 when depositing the first semiconductor layer and the second semiconductor layer; the effects of the environment changes in the reaction chamber 50 can be suppressed; and high reproducibility can be maintained long-term. Thus, semiconductor layers having different compositions can be formed with high uniformity in the surface and high reproducibility.

In the vapor deposition method and the vapor deposition apparatus 210 according to this embodiment, the group III source-material gas may include any gas containing a compound including a group III element. The group V source-material gas may include any gas containing a compound including a group V element.

For example, the group III source-material gas (e.g., the first source-material gas) may include at least one selected from the group consisting of trimethylaluminium, triethylaluminum, dimethylaluminum hydride, dimethyl-ethylamine alane, triisobutylaluminum, trimethylindium, and triethylindium.

The group V source-material gas (e.g., the second source-material gas) may include at least one selected from the group consisting of ammonia, monomethylhydrazine, and dim ethylhydrazine.

Further, the group III source-material gas (e.g., the first source-material gas) and the group V source-material gas (e.g., the second source-material gas) may further include any dopant gas used as the dopant included in the semiconductor layer being deposited. Such a dopant gas may include, for example, monosilane ($SiH_4$) gas as an n-type dopant. For example, bis cyclopentadienyl magnesium ($Cp_2Mg$) and bis methyl-cyclopentadienyl magnesium ($M_2Cp_2Mg$) may be used as a p-type dopant.

First Example

An example of a method for manufacturing the semiconductor light emitting device 110 (a blue light emitting diode) using a nitride semiconductor will now be described as a first example of the vapor deposition method and the vapor deposition apparatus 210 according to this embodiment of the invention.

First, the substrate 90 is placed on the susceptor 91. The substrate 90 may include, for example, sapphire. Then, the pressure of the interior of the reaction chamber 50 is maintained at 500 Torr while introducing hydrogen gas with, for example, a flow rate of 10 L (liters) per minute from each of the first gas introduction unit 11, the second gas introduction unit 21, and the third gas introduction unit 31. Then, the substrate 90 is heated by the heater 92 to, for example, 1100° C. and maintained for 10 minutes.

Then, the temperature of the substrate 90 is set to 500° C.; and nitrogen gas is introduced from the third gas introduction unit 31 with a flow rate of 10 L/min. The first source-material gas (the group III source-material gas), i.e., hydrogen gas including trimethylgallium (TMG) gas, is introduced from the first gas introduction unit 11 with a flow rate of 10 L/min. $NH_3$ gas having a flow rate of 7 L/min and hydrogen gas having a flow rate of 3 L/min are introduced from the second gas introduction unit 21. Thereby, a polycrystal GaN buffer layer 101 is deposited on the substrate 90.

Then, the introduction of the TMG gas supplied from the first gas introduction unit 11 is stopped; and the temperature of the substrate 90 is increased to 1050° C.

Subsequently, nitrogen gas is introduced from the third gas introduction unit 31 with a flow rate of 10 L/min; hydrogen gas including TMG gas and monosilane gas is introduced from the first gas introduction unit 11 with a flow rate of 10 L/min; $NH_3$ gas having a flow rate of 7 L/min and hydrogen gas having a flow rate of 3 L/min are introduced from the second gas introduction unit 21; and the n-type contact layer 102 including GaN doped with Si is deposited.

Then, the introduction of the TMG gas and the monosilane gas introduced from the first gas introduction unit 11 is stopped; and the temperature of the substrate 90 is set to 780° C.

Subsequently, $NH_3$ gas having a flow rate of 7 L/min and nitrogen gas having a flow rate of 3 L/min are introduced from the third gas introduction unit 31; nitrogen gas including TMG gas having a flow rate of 3 L/min and $NH_3$ gas having a flow rate of 7 L/min are introduced from the first gas introduction unit 11; $NH_3$ gas having a flow rate of 7 L/min and nitrogen gas having a flow rate of 3 L/min are introduced from the second gas introduction unit 21; and a barrier layer including GaN is deposited. The thickness of the barrier layer is, for example, 5 nm (nanometers).

Continuing, trimethylindium (TMI) gas is further introduced into the nitrogen gas of the first gas introduction unit 11. In other words, $NH_3$ gas having a flow rate of 7 L/min and nitrogen gas having a flow rate of 3 L/min are introduced from the third gas introduction unit 31; nitrogen gas including TMG gas and TMI gas having a flow rate of 3 L/min and $NH_3$ gas having a flow rate of 7 L/min are introduced from the first gas introduction unit 11; and $NH_3$ gas having a flow rate of 7 L/min and nitrogen gas having a flow rate of 3 L/min are introduced from the second gas introduction unit 21. Thereby, a well layer including GaInN in which the In composition in group III elements is 15% (15 atomic percent) is deposited with a thickness of 2.5 nm.

Subsequently, the combination of the barrier layer recited above and the well layer recited above is deposited repeatedly for a total of 7 times. Subsequently, the barrier layer was further deposited thereon with the same conditions recited above. Thereby, the light emitting layer 103 having a multiple quantum well structure is formed.

Although the flow rate ratio of 0.7 of the $NH_3$ gas to the total flow rate is high when forming the barrier layer and the well layer recited above, the gas introduction unit 51 is separated into three units (the first, second, and third gas introduction units 11, 21, and 31); and the proportions of the flow rate of the gas introduced from each of the gas introduction units (the first, second, and third gas introduction units 11, 21, and 31) are substantially equal. Thereby, the turbulent flow gt of the flow of the gases does not occur for the gases introduced from the first, second, and third gas introduction units 11, 21, and 31; and a stable laminar flow gl is obtained.

Then, the introduction of the TMG gas and the TMI gas introduced from the first gas introduction unit 11 is stopped; and the temperature of the substrate 90 is increased to 1000° C.

Subsequently, nitrogen gas is introduced from the third gas introduction unit 31 with a flow rate of 10 L/min; hydrogen gas including TMG gas, TMA gas, and $Cp_2Mg$ gas is introduced from the first gas introduction unit 11 with a flow rate of 10 L/min; $NH_3$ gas having a flow rate of 5 L/min and hydrogen gas having a flow rate of 5 L/min are introduced from the second gas introduction unit 21; and the p-type electron blocking layer 104 is deposited. The p-type electron blocking layer 104 is AlGaN having an Al composition of 15% doped with Mg. Here, the group III source-material gas including TMA introduced from the first gas introduction unit 11 and the $NH_3$ gas introduced from the second gas introduction unit 21 are separated from each other up to the outlets (the outlet of the first gas introduction unit 11 and the outlet of the second gas introduction unit 21) by the first partition 11a, are supplied from the respective outlets, form the laminar flow gl, and are supplied toward the substrate 90. Thereby, the vapor phase reaction between the TMA gas and the $NH_3$ gas can be suppressed.

Then, the introduction of the TMA gas introduced from the first gas introduction unit 11 is stopped; and the p-type contact layer 105 is deposited while maintaining the states of the other gases. The p-type contact layer 105 is GaN doped with Mg.

Then, the substrate 90 for which the depositing is complete is removed; the p-side transparent electrode 106, the p-side electrode 107, and the n-side electrode 108 are formed; and the semiconductor light emitting device 110 is constructed.

Characteristics of the semiconductor light emitting device 110 according to the vapor deposition method of the first example recited above and a semiconductor light emitting device according to a method of a first comparative example described below will now be described.

When forming the barrier layer of the light emitting layer 103 in the method of the first comparative example, nitrogen gas is introduced from the third gas introduction unit 31 with a flow rate of 4 L/min; nitrogen gas including TMG gas is introduced from the first gas introduction unit 11 with a flow rate of 4 L/min; and $NH_3$ gas having a flow rate of 21 L/min and nitrogen gas having a flow rate of 1 L/min are introduced from the second gas introduction unit 21. When depositing the well layer of the light emitting layer 103, nitrogen gas is introduced from the third gas introduction unit 31 with a flow rate of 4 L/min; nitrogen gas including TMG gas and TMI gas is introduced from the first gas introduction unit 11 with a flow rate of 4 L/min; and $NH_3$ gas having a flow rate of 21 L/min and nitrogen gas having a flow rate of 1 L/min are introduced from the second gas introduction unit 21. Otherwise, conditions similar to those of the first example may be used.

Both the semiconductor light emitting device 110 according to the first example and the semiconductor light emitting device according to the first comparative example are blue LEDs. Multiple semiconductor light emitting devices are formed in a two-inch substrate surface by the method of the first example and the method of the first comparative example. The characteristics of the light emission output in the substrate surface in such a case are as follows.

In the semiconductor light emitting device according to the first comparative example, the light emission output at the peripheral portion of the substrate 90 decreases; and the light emission output at the peripheral portion of the substrate 90 is, for example, not more than 85% of that at the center of the substrate 90. Conversely, the fluctuation of the light emission output of the semiconductor light emitting device 110 according to the first example is, for example, within a range of ±5% in the surface of the substrate 90; and light emission is obtained uniformly in the surface of the substrate 90. The average of light emission output in the surface of the substrate 90 for the semiconductor light emitting device 110 according to the first example is greater than that of the semiconductor light emitting device according to the first comparative example by not less than 10%.

Thus, according to the vapor deposition method and the vapor deposition apparatus 210 according to this embodiment, each of the semiconductor layers having different compositions (e.g., the p-type electron blocking layer 104, i.e., the first semiconductor layer, and the well layer of the light emitting layer 103, i.e., the second semiconductor layer) can be formed with high uniformity in the surface and high reproducibility. Thereby, the manufactured semiconductor light emitting device 110 has less fluctuation of the light emission output in the substrate surface and a higher average light emission output than the first comparative example. Thus, according to this embodiment, it is possible to obtain good characteristics with high yield.

Second Embodiment

Figure 7:
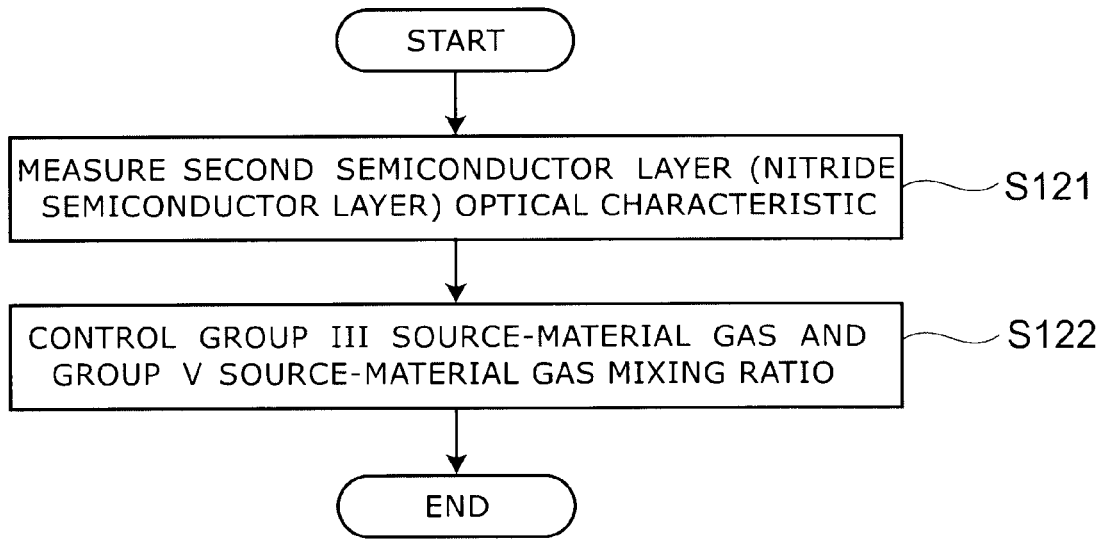
FIG. 7 is a flowchart showing a vapor deposition method.

FIG. 6 is a schematic view illustrating the configuration of a vapor deposition apparatus according to a second embodiment of the invention. FIG. 7 is a flowchart illustrating a vapor deposition method according to the second embodiment of the invention.

As illustrated in FIG. 6, the vapor deposition apparatus 211 according to this embodiment is the vapor deposition apparatus 210 according to the first embodiment further including a measurement unit 60 and a control unit 70.

In this specific example, the measurement unit 60 is provided outside the reaction chamber 50 above the susceptor 91 (above the surface where the substrate 90 is placed).

The measurement unit 60 measures optical characteristics of the surface (e.g., the second semiconductor layer) of the substrate 90 when depositing the second semiconductor layer.

The control unit 70 controls the mixing ratio of the group III source-material gas and the group V source-material gas based on at least one selected from the temperature of the substrate 90, the growth rate of the second semiconductor layer, and the composition of the second semiconductor layer derived from the optical characteristics measured by the measurement unit 60.

The measurement unit 60 recited above may measure the optical characteristics of the first semiconductor layer when depositing the first semiconductor layer; and the control unit 70 may further control at least one selected from the flow rate of the group III source-material gas and the flow rate of the group V source-material gas based on at least one selected from the temperature of the substrate 90, the growth rate of the first semiconductor layer, and the composition of the first semiconductor layer derived from the optical characteristics measured by the measurement unit 60.

In other words, the measurement unit 60 measures the optical characteristics of the substrate 90 when depositing the nitride semiconductor layer being deposited on the substrate 90. For example, during the film formation, the measurement unit 60 measures the light emitted from the surface of the substrate 90 (or the susceptor 91) to measure the temperature of the substrate 90. The measurement unit 60 may irradiate light onto the surface of the substrate 90 (the nitride semiconductor layer being formed) and measure the change of the reflectance of the irradiated light to measure the growth rate of the nitride semiconductor layer being formed. The measurement unit 60 measures the composition of the mixed crystal of the nitride semiconductor layer being formed based on the reflectance spectrum of the irradiated light.

An optical monitoring light path 61 passes through a not-illustrated window unit of the reaction chamber 50 when the measurement unit 60 measures the optical characteristics. Thereby, the measurement unit 60 measures the deposition state of the semiconductor layer of the substrate 90 from outside the reaction chamber 50 simultaneously with the depositing.

The measurement results of the optical characteristics by the measurement unit 60 are output to the control unit 70 via a measurement data signal line 62. A mixing control signal output from the control unit 70 is output to the mixing gas mass flow controller 43m via a mixing control signal line 71. A first control signal output from the control unit 70 is output to the first mass flow controller 13m via a first control signal line 72. A heater control signal output from the control unit 70 is output to the heater control unit 93 via a heater control signal line 73.

Thus, in the vapor deposition apparatus 211, the measurement unit 60 is provided outside the reaction chamber 50 on the side opposing the upper face of the substrate 90 to measure the substrate temperature, the growth rate of the semiconductor layer, and the mixed crystal composition of the semiconductor layer; and the control unit 70 controls the mass flow controllers (the mixing gas mass flow controller 43m and the first mass flow controller 13m) and the heater control unit 93.

For example, when depositing the second semiconductor layer, the control unit 70 changes, for example, the mixing ratio of the group III source-material gas and the group V source-material gas introduced from the first gas introduction unit 11 based on the measurement data of at least one selected from the substrate temperature, the growth rate, and the mixed crystal composition.

For example, in the case where the In composition of the second semiconductor layer is lower than the target composition based on the characteristics recited above measured when depositing the second semiconductor layer, the control unit 70 performs a control to relatively increase the ratio of the group V source-material gas to the gas mixture of the group III source-material gas and the group V source-material gas introduced from the first gas introduction unit 11.

Thus, the effects of the reaction products proximal to the substrate 90 are compensated and the reproducibility of the film being deposited can be increased by optically measuring the characteristics of the semiconductor layer by the measurement unit 60 and changing the mixing ratio of the group III source-material gas and the group V source-material gas when depositing the semiconductor layer.

In other words, in the vapor deposition method according to this embodiment as illustrated in FIG. 7, the depositing of the second semiconductor layer (step S120) may include measuring the optical characteristics of the second semiconductor layer (the nitride semiconductor layer) while depositing the second semiconductor layer (step S121) and controlling the mixing ratio of the group III source-material gas and the group V source-material gas based on at least one selected from the temperature of the substrate 90, the growth rate of the second semiconductor layer, and the composition of the second semiconductor layer derived from the measurement results of the optical characteristics (step S122). By using the vapor deposition method according to this embodiment, the reproducibility of the deposited semiconductor layer can be increased.

In other words, the degree and history of the reaction products adhered in portions proximal to the substrate 90 in the reaction chamber 50 change the thermal environment of the portions proximal to the substrate 90 and reduce the reproducibility of the semiconductor layer being deposited. However, by using the vapor deposition method and the vapor deposition apparatus 211 according to this embodiment, the decrease of the reproducibility is suppressed; and a semiconductor light emitting device can be manufactured long-term with excellent reproducibility.

Second Example

Figure 8:
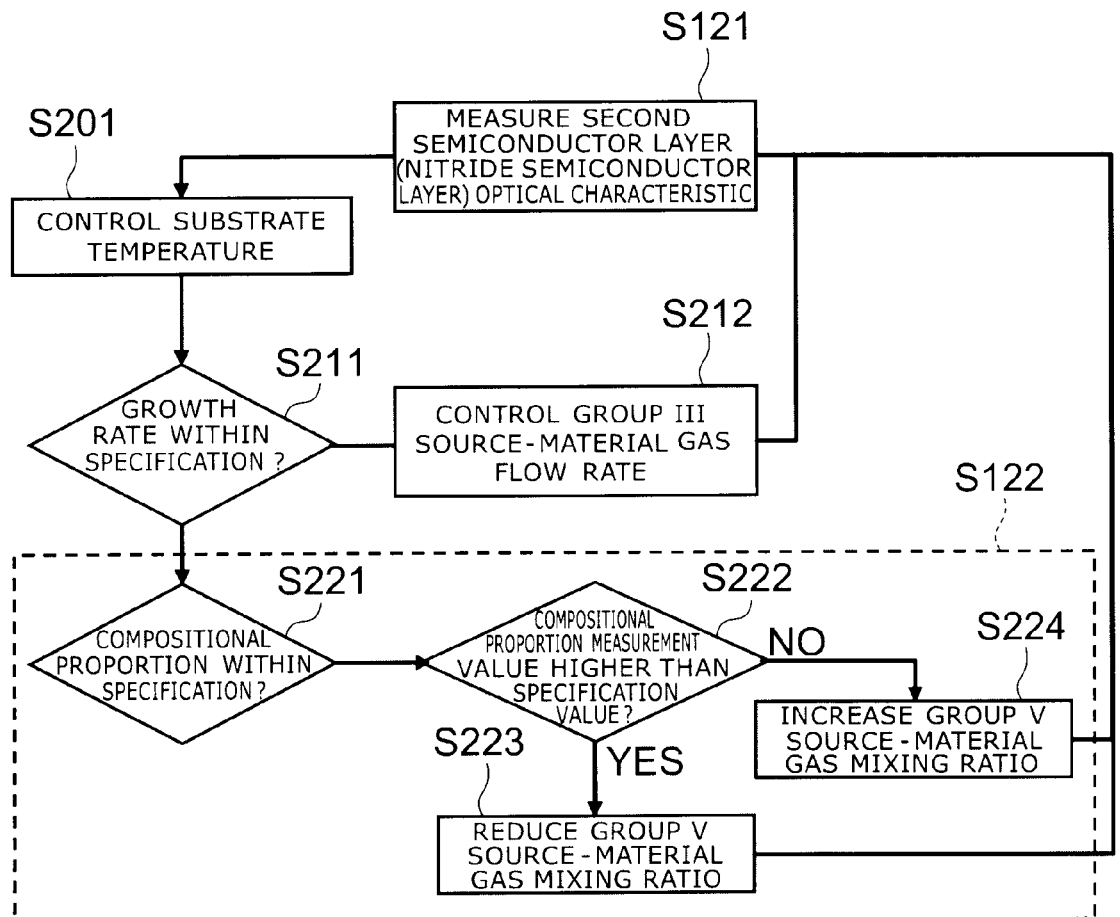
FIG. 8 is a flowchart showing a vapor deposition method.

FIG. 8 is a flowchart illustrating a vapor deposition method of a second example of the second embodiment of the invention.

Namely, FIG. 8 is an example of control using the measurement unit 60 of the depositing of the second semiconductor layer including In (step S120) using the vapor deposition apparatus 211.

The measurement value of the growth rate of the second semiconductor layer is compared to a specification value (step S211); and the flow rate of the group III source-material gas is controlled such that the difference between the measurement value of the growth rate of the second semiconductor layer and the specification is within 5% (step S212). For example, the flow rate of the group III source-material gas may be set to a value of (the current set flow rate)×(the specification value of the growth rate)/(the measurement value of the growth rate).

The measurement value of the compositional proportion (in this case, the compositional proportion of In) of the second semiconductor layer is compared to a specification value (a set value) (step S221). Then, it is further determined whether or not the measurement value of the compositional proportion of the second semiconductor layer is higher than the specification value (step S222); and in the case where the measurement value of the compositional proportion is lower than the specification value, the mixing ratio of the group V source-material gas to the mixture of the group III source-material gas and the group V source-material gas is increased (step S224). In the case where the measurement value of the compositional proportion is higher than the specification value, the mixing ratio of the group V source-material gas to the mixture of the group III source-material gas and the group V source-material gas is reduced (step S223). In the case where the measurement value of the compositional proportion substantially matches the specification value, the mixing ratio is not changed.

For example, the In compositional proportion is measured while depositing the second semiconductor layer (step S121); and the measurement value is compared to the specification value. In the case where the measurement value is lower than the specification value by an amount not less than 5%, the flow rate of the $NH_3$ gas (the group V source-material gas) introduced to the first gas introduction unit is increased, for example, to 5% more than the current set value; and the mixing ratio of the group V source-material gas is increased. In the case where the measurement value of the In compositional proportion is higher than the specification value by an amount of not less than 5%, the flow rate of the $NH_3$ gas introduced to the first gas introduction unit is reduced, for example, to 5% lower than the current set value; and the mixing ratio of the group V source-material gas is increased. Then, step S221 to step S224 are implemented repeatedly.

In this specific example, the second semiconductor layer is deposited by controlling the temperature of the substrate 90 (step S201) by controlling the heater 92 by PID control based on the measured temperature of the substrate 90.

Thereby, the decrease of the reproducibility of the semiconductor layer being deposited is suppressed; and a semiconductor light emitting device can be manufactured long-term with excellent reproducibility.

Third Embodiment

Figure 9:
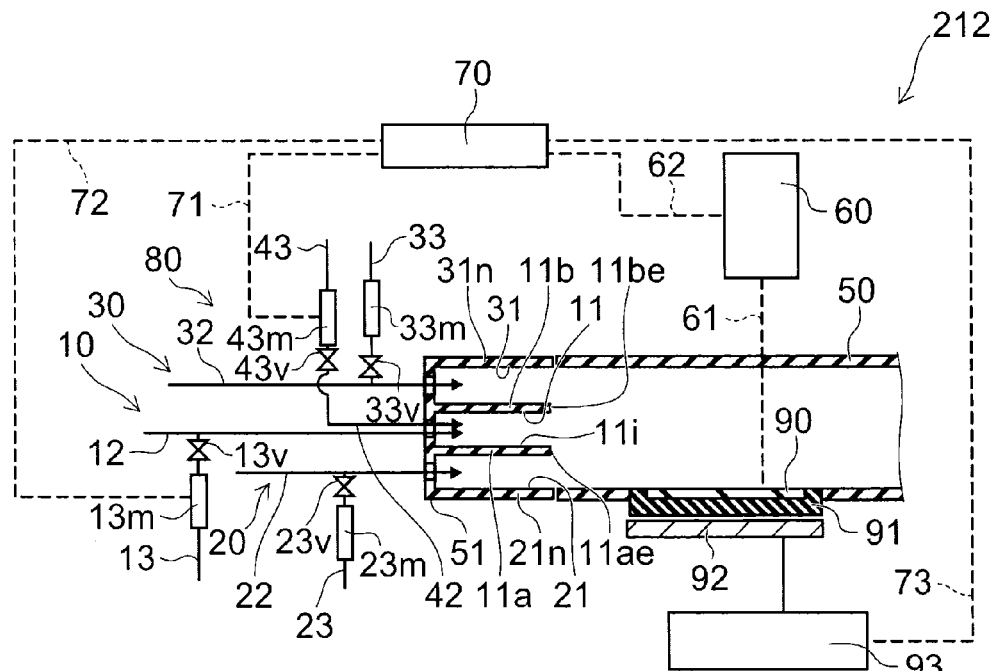
FIG. 9 is a schematic view showing a vapor deposition apparatus.

FIG. 9 is a schematic view illustrating the configuration of a vapor deposition apparatus according to a third embodiment of the invention. In the vapor deposition apparatus 212 according to this embodiment as illustrated in FIG. 9, the first pipe 12 and a mixing pipe 42 are connected to the first gas introduction unit 11 of the first gas supply unit 10. The external mixing unit 45 is not provided. Otherwise, the second gas supply unit 20, the third gas supply unit 30, the reaction chamber 50, and the other configurations are similar to those of the vapor deposition apparatus 211 according to the second embodiment, and a description is therefore omitted.

At least one selected from hydrogen gas and nitrogen gas, for example, is introduced to the first pipe 12; and the first source-material gas pipe 13 also is connected to the first pipe 12 via the first valve 13v and the first mass flow controller 13m. One selected from the group III source-material gas and the group V source-material gas (e.g., the group III source-material gas, i.e., the first source-material gas) is introduced to the first source-material gas pipe 13.

The second source-material gas pipe 43 for mixing is connected to the mixing pipe 42 via the mixing gas valve 43v and the mixing gas mass flow controller 43m. The other one of the group III source-material gas and the group V source-material gas (e.g., the group V source-material gas, i.e., the second source-material gas) is introduced to the second source-material gas pipe 43 for mixing.

By introducing both the first source-material gas and the second source-material gas to the first gas introduction unit 11, these gases are mixed upstream (the direction opposite to the direction toward the substrate 90) from the end portion 11ae of the first partition 11a. Thereby, step S120 of depositing the second semiconductor layer can be implemented. In other words, the first gas introduction unit 11 forms an internal mixing unit 11i that mixes the group III source-material gas and the group V source-material gas.

In the case where only the first source-material gas is introduced to the first gas introduction unit 11, the first source-material gas can be introduced in a state of being separated from the second source-material gas introduced from the second gas introduction unit 21. Thereby, step S110 of depositing the first semiconductor layer can be implemented.

Thus, the first gas supply unit 10 includes: the first supply pipe (the first pipe 12) communicating with the reaction chamber 50 to supply one selected from the group III source-material gas and the group V source-material gas (e.g., the group III source-material gas, i.e., the first source-material gas) into the reaction chamber 50; and the second supply pipe (the mixing pipe 42) communicating with the reaction chamber 50 to supply the other one of the group III source-material gas and the group V source-material gas (e.g., the group V source-material gas, i.e., the second source-material gas) into the reaction chamber 50. The mixing unit (the internal mixing unit 11i) is a portion in the interior of the reaction chamber 50 to which the first supply pipe and the second supply pipe are connected. The group III source-material gas and the group V source-material gas mix with each other in the internal mixing unit 11i which is on the first and second supply pipe side of the end portion (e.g., the end portion 11ae) on the substrate 90 side. The mixed group III and group V source-material gases are supplied toward the substrate 90 from the same outlet (the first gas introduction unit 11).

The vapor deposition apparatus 212 having such a configuration also can implement the operation of supplying the group III source-material gas and the group V source-material gas from mutually different outlets toward the substrate 90 disposed in the reaction chamber 50 to deposit the first semiconductor layer including a nitride semiconductor having a compositional proportion of Al in group III elements of not less than 10 atomic percent and the operation of mixing the group III source-material gas and the group V source-material gas and supplying the mixed group III and group V source-material gases from the same outlet toward the substrate 90 to deposit the second semiconductor layer including a nitride semiconductor having a compositional proportion of Al in group III elements of less than 10 atomic percent.

Fourth Embodiment

Figure 10A:
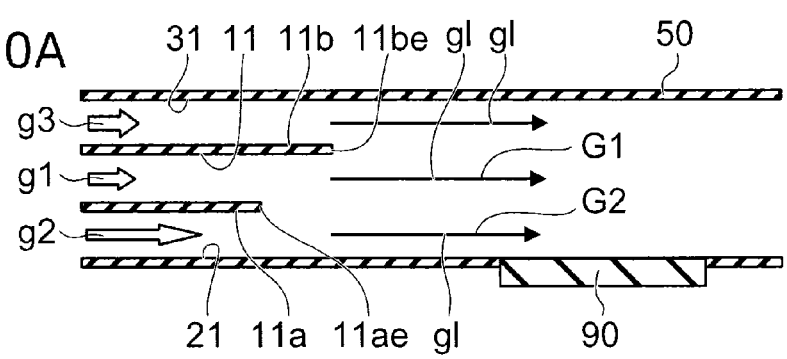
FIG. 10A and FIG. 10B are schematic views showing a vapor deposition method.
Figure 10B:
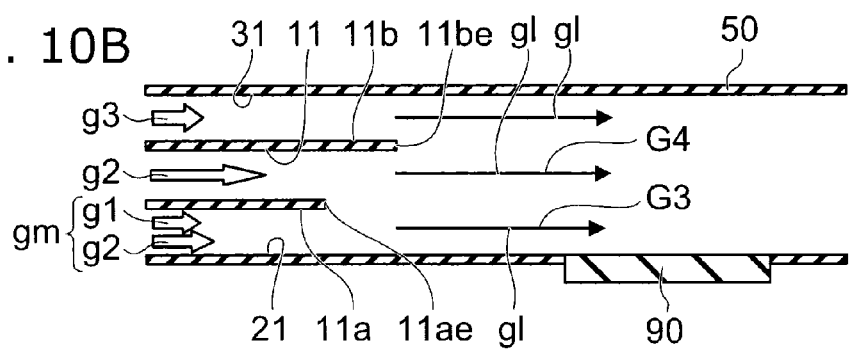

FIGS. 10A and 10B are schematic views illustrating a vapor deposition method according to a fourth embodiment of the invention.

Namely, FIG. 10A corresponds to the depositing of the first semiconductor layer including a nitride semiconductor having an Al compositional proportion of not less than 10 atomic percent (step S110); and FIG. 10B corresponds to the depositing of the second semiconductor layer including a nitride semiconductor having an Al compositional proportion of less than 10 atomic percent (step S120).

When depositing the first semiconductor layer as illustrated in FIG. 10A, the first source-material gas g1 (the first gas flow G1) is supplied from the first gas introduction unit 11 toward the substrate 90. The first source-material gas g1 may include, for example, a group III source-material gas, e.g., trimethylaluminium (TMA).

The second source-material gas g2 (the second gas flow G2) is supplied from the second gas introduction unit 21 toward the substrate 90. The second source-material gas g2 may include the group V source-material gas of ammonia ($NH_3$).

The third source-material gas g3 is supplied from the third gas introduction unit 31 toward the substrate 90. The third source-material gas g3 may include, for example, $N_2$. The third source-material gas g3 flows toward the substrate 90 as a sub-flow to straighten the flow of the gases.

In such a case as well, the first source-material gas g1 and the second source-material gas g2 are separated from each other up to the end portion 11ae of the first partition 11a, are substantially maintained in the separated state even after exiting from the first gas introduction unit 11 and the second gas introduction unit 21, respectively, and reach the substrate 90 as the laminar flow gl. Thereby, the reaction products do not easily adhere to the unnecessary portions other than the upper face of the substrate 90; the control range of the Al composition is wide for the first semiconductor layer being deposited; and a semiconductor layer having any Al composition is obtained easily. The source-material gases reach the substrate 90 as the laminar flow gl. Therefore, the uniformity in the surface of the composition of the first semiconductor layer is high and the uniformity in the surface of the film thickness of the first semiconductor layer is high. Further, the reproducibility of the composition of the first semiconductor layer is high and the reproducibility of the film thickness of the first semiconductor layer is high.

Then, when depositing the second semiconductor layer as illustrated in FIG. 10B, the group V source-material gas (the fourth gas flow G4) of $NH_3$ gas is supplied as the second source-material gas g2 from the first gas introduction unit 11.

The first source-material gas g1 and the second source-material gas g2 are mixed (into the third gas flow G3) and supplied toward the substrate 90 from the second gas introduction unit 21. At this time, the first source-material gas g1 may include, for example, a group III source-material gas, e.g., trimethylindium (TMI) and TMG. The second source-material gas g2 may include the group V source-material gas of $NH_3$. In other words, the gas mixture gm of the group III source-material gas of TMI and the group V source-material gas of $NH_3$ is supplied toward the substrate 90 from the second gas introduction unit 21.

The third source-material gas g3 ($N_2$) from the third gas introduction unit 31 may be used. In such a case as well, the third source-material gas g3 flows toward the substrate 90 as a sub-flow to straighten the flow of the gases.

Thus, the gas mixture gm of TMI, TMG, and $NH_3$ can be supplied from the second gas introduction unit 21 while supplying $NH_3$ from the first gas introduction unit 11. Therefore, it is easy to increase the ratio of the $NH_3$ to the entirety. In other words, the occurrence of turbulent flow is suppressed by limiting the flow rate of the $NH_3$ supplied from the first gas introduction unit 11 to about the same rate as those of the other gas introduction units at which turbulent flow does not occur and by supplying the gas mixture gm of TMI, TMG, and the $NH_3$ from the second gas introduction unit 21; and the flow rate ratio of the $NH_3$ gas to the total flow rate can be increased while maintaining the laminar flow gl. Thereby, the second semiconductor layer having the low Al compositional proportion can be deposited using a high flow rate ratio of the $NH_3$ gas; the uniformity in the surface of the composition and film thickness of the second semiconductor layer can be increased; and the reproducibility of the composition and film thickness of the second semiconductor layer can be increased.

Thus, the vapor deposition method according to this embodiment also includes: the depositing of the first semiconductor layer by supplying the group III source-material gas and the group V source-material gas toward the substrate 90 from mutually different outlets (the first gas introduction unit 11 and the second gas introduction unit 21) (step S110); and the depositing of the second semiconductor layer by mixing the group III source-material gas and the group V source-material gas and supplying the mixed group III and group V source-material gases toward the substrate from the same outlet (the second gas introduction unit 21) (step S120). In such a case as well, step S120 further supplies one selected from the group III source-material gas and the group V source-material gas (in this case, the group V source-material gas) toward the substrate 90 from an outlet (the first gas introduction unit 11) different from the outlet of the mixed group III and group V source-material gases recited above.

According to the vapor deposition method according to this embodiment, semiconductor layers having different compositions can be formed with high uniformity in the surface and high reproducibility.

Such a vapor deposition method can be implemented using, for example, the vapor deposition apparatus recited below.

Figure 11:
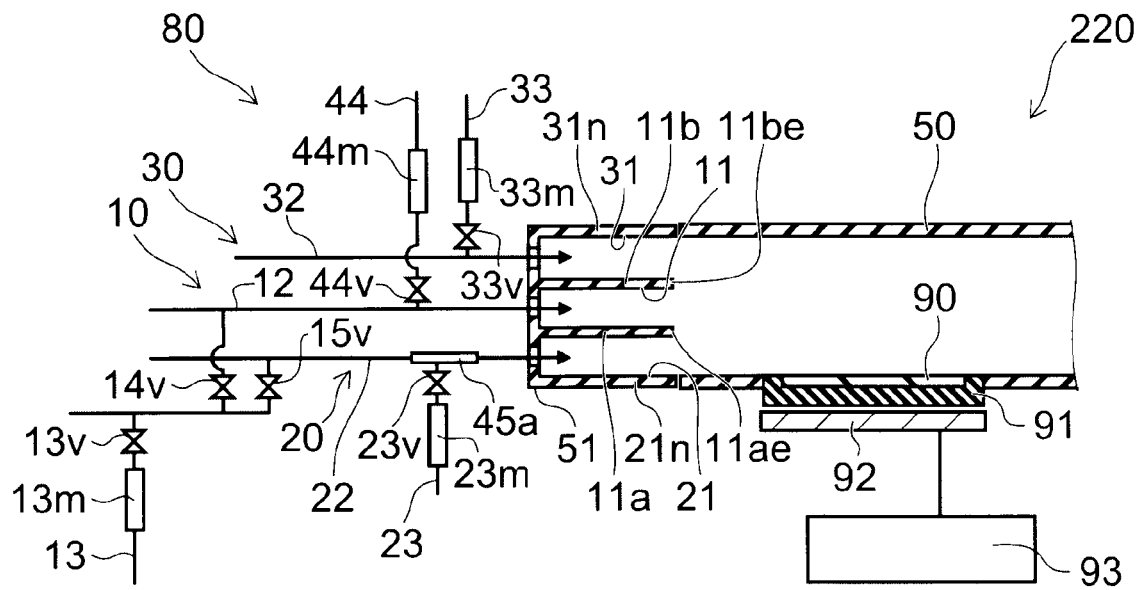
FIG. 11 is a schematic view showing a vapor deposition apparatus.

FIG. 11 is a schematic view illustrating the configuration of a vapor deposition apparatus according to a fourth embodiment of the invention.

In the vapor deposition apparatus 220 according to this embodiment as illustrated in FIG. 11 as well, the gas introduction unit 51 is subdivided into three portions by partitions; and the second gas introduction unit 21, the first gas introduction unit 11, and the third gas introduction unit 31 are provided as the gas introduction unit 51.

The first gas supply unit 10 and the second gas supply unit 20 are divided from each other by a partition (the first partition 11a). The first gas supply unit 10 and the third gas supply unit 30 are divided from each other by a partition (the second partition 11b).

The second pipe 22 is connected to the second gas introduction unit 21. At least one selected from hydrogen gas and nitrogen gas, for example, is introduced to the second pipe 22 via, for example, a not-illustrated valve and a not-illustrated mass flow controller. Thereby, the at least one selected from hydrogen gas and nitrogen gas is introduced to the second gas introduction unit 21 with a controlled flow rate.

The second source-material gas pipe 23 is connected to the second pipe 22 via the second valve 23v and the second mass flow controller 23m. An NH₃ gas cylinder, for example, is connected to the side of the second source-material gas pipe 23 opposite to the second mass flow controller 23m. In other words, the group V source-material gas of NH₃ gas, i.e., the second source-material gas, is supplied to the second source-material gas pipe 23. Thereby, the second source-material gas (in this example, the group V source-material gas), i.e., NH₃ gas, is supplied to the second gas introduction unit 21 with a controlled flow rate.

The first source-material gas pipe 13 is connected to the side of the second pipe 22 opposite to the side connected to the reaction chamber 50 via a second distribution valve 15v and the first valve 13v.

An external mixing unit 45a (the mixing unit) provided between the reaction chamber 50 and the second valve 23v of the second pipe 22.

Thereby, in one operating state, the second source-material gas g2 (e.g., NH₃ gas) can be introduced through the second source-material gas pipe 23 to the second gas introduction unit 21. The second source-material gas g2 is supplied from the second gas introduction unit 21 toward the substrate 90.

In one other operating state, the first source-material gas g1 is introduced from the first source-material gas pipe 13 to the mixing unit 45a; simultaneously, the second source-material gas g2 is introduced from the second source-material gas pipe 23 to the mixing unit 45a; and the mixed first source-material gas g1 and second source-material gas g2 are introduced to the second gas introduction unit 21. Then, the mixed first source-material gas g1 and second source-material gas g2 are supplied from the second gas introduction unit 21 toward the substrate 90.

On the other hand, the first pipe 12 is connected to the first gas introduction unit 11. At least one selected from hydrogen gas and nitrogen gas, for example, is introduced to the first pipe 12 via, for example, a not-illustrated valve and a not-illustrated mass flow controller. Thereby, the at least one selected from hydrogen gas and nitrogen gas is introduced to the first gas introduction unit 11 with a controlled flow rate.

The first source-material gas pipe 13 is connected to the first pipe 12 via a first distribution valve 14v, the first valve 13v, and the first mass flow controller 13m. A pipe is connected to the side of the first source-material gas pipe 13 opposite to the first mass flow controller 13m to introduce, for example, the group III source-material gas of a metal-organic gas, i.e., the first source-material gas. In other words, the group III source-material gas of a metal-organic gas, i.e., the first source-material gas, is supplied to the first source-material gas pipe 13.

A second source-material gas pipe 44 for switching is connected to the first pipe 12 via a switching gas valve 44v and a switching gas mass flow controller 44m. In this example, the position where the second source-material gas pipe 44 for switching is connected to the first pipe 12 is downstream from the position where the first source-material gas pipe 13 is connected to the first pipe 12.

Thereby, in one operating state, the second source-material gas g2 is not supplied from the second source-material gas pipe 44 for switching; and the first source-material gas g1 (e.g., the group III source-material gas) can be introduced through the first source-material gas pipe 13 to the first gas introduction unit 11. The first source-material gas g1 is supplied from the first gas introduction unit 11 toward the substrate 90.

In one other operating state, the supply of the first source-material gas g1 from the first source-material gas pipe 13 is stopped; and the second source-material gas g2 (e.g., NH₃ gas) can be introduced to the first gas introduction unit 11 through the second source-material gas pipe 44 for switching. The second source-material gas g2 (e.g., NH₃ gas) is supplied from the first gas introduction unit 11 toward the substrate 90.

In other words, in the vapor deposition apparatus 220, at least one gas supply unit selected from the first gas supply unit 10 and the second gas supply unit 20 (in this specific example, the second gas supply unit 20) includes a mixing unit (in this specific example, the external mixing unit 45) mixing the group III source-material gas and the group V source-material gas and supplying the mixed group III and group V source-material gases toward the reaction chamber 50 side of the at least one gas supply unit recited above (the second gas supply unit 20); and the at least one gas supply unit recited above (in this specific example, the second gas supply unit 20) further is capable of supplying the group III source-material gas and the group V source-material gas mixed by the mixing unit toward the substrate 90 disposed in the reaction chamber 50.

In this specific example, the mixing unit (the external mixing unit 45a) is provided in the second gas supply unit 20; and the second gas supply unit 20 further includes the second pipe 22 introducing the other one of the group III source-material gas and the group V source-material gas (in this case, the group V source-material gas). The mixing unit (the external mixing unit 45a) is provided between the second pipe 22 and the reaction chamber 50. A pipe (the first source-material gas pipe 13) is connected to the second pipe 22 side of the mixing unit (the external mixing unit 45a) to introduce one selected from the group III source-material gas and the group V source-material gas (in this case, the group III source-material gas).

In step S110 in such a vapor deposition apparatus 220, the second source-material gas g2 is supplied from the second gas introduction unit 21 toward the substrate 90; and the first source-material gas g1 is supplied from the first gas introduction unit 11 toward the substrate 90.

In step S120, the mixed first source-material gas g1 and second source-material gas g2 are supplied from the second gas introduction unit 21 toward the substrate 90; and the second source-material gas g2 is supplied from the first gas introduction unit 11 toward the substrate 90.

Thus, according to the vapor deposition apparatus 220, the vapor deposition method illustrated in FIG. 10 can be realized.

Figure 12:
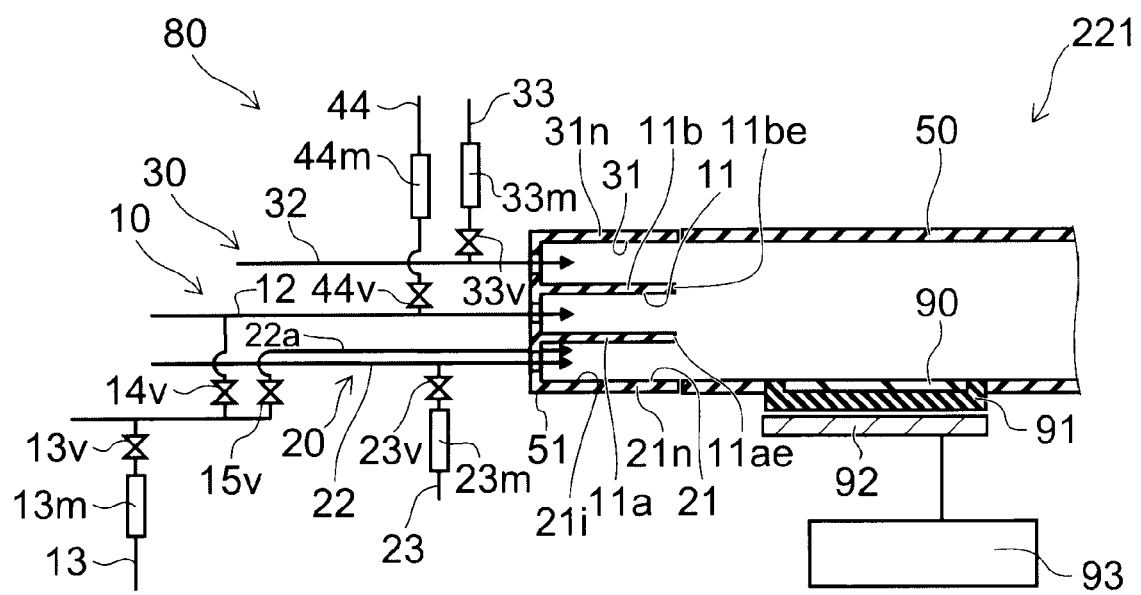
FIG. 12 is a schematic view showing a vapor deposition apparatus.

FIG. 12 is a schematic view illustrating the configuration of another vapor deposition apparatus according to the fourth embodiment of the invention.

In the vapor deposition apparatus 221 according to this embodiment as illustrated in FIG. 12, the second pipe 22 and a mixing pipe 22a are connected to the second gas introduction unit 21 of the second gas supply unit 20 of the vapor deposition apparatus 220 illustrated in FIG. 11; and the external mixing unit 45a is not provided. Otherwise, the first gas supply unit 10, the third gas supply unit 30, the reaction chamber 50, and the other configurations are similar to those of the vapor deposition apparatus 220, and a description is therefore omitted.

At least one selected from hydrogen gas and nitrogen gas, for example, is introduced to the second pipe 22; and the second source-material gas pipe 23 is connected to the second pipe 22 via the second valve 23v and the second mass flow controller 23m. The other one of the group III source-material gas and the group V source-material gas (e.g., the group V source-material gas, i.e., the second source-material gas) is introduced to the second source-material gas pipe 23.

The first source-material gas pipe 13 is connected to the mixing pipe 22a via the second distribution valve 15v, the first valve 13v, and the first gas mass flow controller 13m. One selected from the group III source-material gas and the group V source-material gas (e.g., the group III source-material gas, i.e., the first source-material gas) is introduced to the first source-material gas pipe 13.

Step S110 in the vapor deposition apparatus 221 having such a configuration is performed as follows. In the first gas supply unit 10, the supply of the second source-material gas g2 from the second source-material gas pipe 44 for switching is stopped; the first source-material gas g1 (e.g., the group III source-material gas) is introduced through the first source-material gas pipe 13 to the first gas introduction unit 11; and the first source-material gas g1 is supplied from the first gas introduction unit 11 toward the substrate 90.

In the second gas supply unit 20, the second distribution valve 15v is switched to a closed state; the second source-material gas g2 (e.g., the group V source-material gas) is introduced through the second source-material gas pipe 23 to the second gas introduction unit 21; and the second source-material gas g2 is supplied from the second gas introduction unit 21 toward the substrate 90.

Thereby, the group III source-material gas and the group V source-material gas are supplied from mutually different outlets toward the substrate 90 to deposit the first semiconductor layer.

Then, step S120 is performed as follows.

In the first gas supply unit 10, the first distribution valve 14v is switched to a closed state; the second source-material gas g2 (e.g., the group V source-material gas) is introduced from the second source-material gas pipe 44 for switching to the first gas introduction unit 11; and the second source-material gas g2 is supplied from the first gas introduction unit 11 toward the substrate 90.

In the second gas supply unit 20, the second distribution valve 15v is switched to an opened state; the first source-material gas g1 (e.g., the group III source-material gas) is introduced through the first source-material gas pipe 13 to the second gas introduction unit 21; and simultaneously, the second source-material gas g2 (e.g., the group V source-material gas) is introduced through the second source-material gas pipe 23. Then, these gases mix upstream (the direction opposite to the direction toward the substrate 90) from the end portion 11ae of the first partition 11a of the second gas introduction unit 21. Thereby, the mixed first source-material gas g1 and second source-material gas g2 are supplied from the second gas introduction unit 21 toward the substrate 90. In other words, the second gas introduction unit 21 forms an internal mixing unit 21i that mixes the group III source-material gas and the group V source-material gas.

In the vapor deposition apparatus 221, the second gas supply unit 20 includes: the third supply pipe (the mixing pipe 22a) communicating with the reaction chamber 50 to supply one selected from the group III source-material gas and the group V source-material gas (e.g., the group III source-material gas, i.e., the first source-material gas) into the reaction chamber 50; and the fourth supply pipe (the second pipe 22) communicating with the reaction chamber 50 to supply the other one of the group III source-material gas and the group V source-material gas (e.g., the group V source-material gas, i.e., the second source-material gas) into the reaction chamber 50. The mixing unit (the internal mixing unit 21i) is a portion in the interior of the reaction chamber 50 to which the third supply pipe and the fourth supply pipe are connected; and the group III source-material gas and the group V source-material gas mix with each other on the third and fourth supply pipe side of the end portion of the mixing unit (the internal mixing unit 21i). Then, the mixed group III and group V source-material gases are supplied from the same outlet (the second gas introduction unit 21) toward the substrate 90.

In the vapor deposition apparatus 221 having such a configuration as well, the vapor deposition method illustrated in FIG. 10 can be realized.

Fifth Embodiment

Figure 13A:
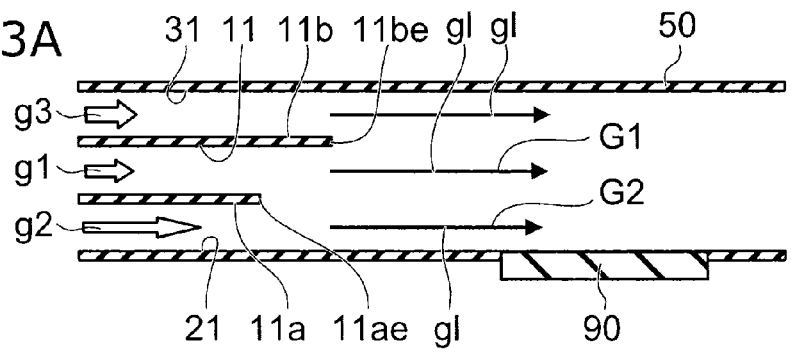
FIG. 13A and FIG. 13B are schematic views showing a vapor deposition method.
Figure 13B:
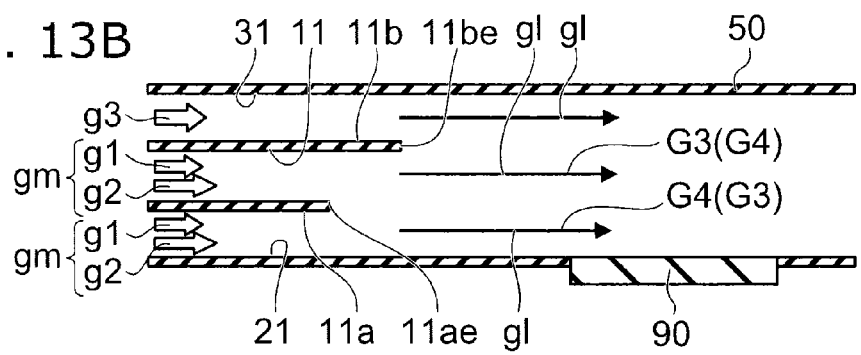

FIGS. 13A and 13B are schematic views illustrating a vapor deposition method according to a fifth embodiment of the invention.

Namely, FIG. 13A corresponds to depositing the first semiconductor layer including a nitride semiconductor having an Al compositional proportion of not less than 10 atomic percent (step S110); and FIG. 13B corresponds to depositing the second semiconductor layer including a nitride semiconductor having an Al compositional proportion of less than 10 atomic percent (step S120).

When depositing the first semiconductor layer as illustrated in FIG. 13A, the first source-material gas g1 (the first gas flow G1) is supplied from the first gas introduction unit 11 toward the substrate 90. The first source-material gas g1 may include, for example, a group III source-material gas, e.g., trimethylaluminium (TMA) and TMG.

The second source-material gas g2 (the second gas flow G2) is supplied from the second gas introduction unit 21 toward the substrate 90. The second source-material gas g2 may include the group V source-material gas of ammonia ($NH_3$).

The third source-material gas g3 is supplied from the third gas introduction unit 31 toward the substrate 90. The third source-material gas g3 may include, for example, $N_2$. The third source-material gas g3 flows toward the substrate 90 as a sub-flow to straighten the flow of the gases.

In such a case as well, the first source-material gas g1 and the second source-material gas g2 are separated from each other up to the end portion 11ae of the first partition 11a, are substantially maintained in the separated state even after exiting from the first gas introduction unit 11 and the second gas introduction unit 21, respectively, and reach the substrate 90 as the laminar flow gl. Thereby, the reaction products do not easily adhere on the unnecessary portions other than the surface of the substrate 90; the control range of the Al composition is wide for the first semiconductor layer being deposited; and a semiconductor layer having any Al composition is obtained easily. Because the source-material gases reach the substrate 90 as the laminar flow gl, the uniformity in the surface of the composition of the first semiconductor layer is high and the uniformity in the surface of the film thickness of the first semiconductor layer is high. Also, the reproducibility of the composition of the first semiconductor layer is high and the reproducibility of the film thickness of the first semiconductor layer is high.

When depositing the second semiconductor layer as illustrated in FIG. 13B, the first source-material gas g1 and the second source-material gas g2 are mixed (into the third gas flow G3 or the fourth gas flow G4) and supplied toward the substrate 90 from both the first gas introduction unit 11 and the second gas introduction unit 21. At this time, the first source-material gas g1 may include, for example, a group III source-material gas, e.g., trimethylindium (TMI) and TMG. The second source-material gas g2 may include the group V source-material gas of $NH_3$. In other words, the gas mixture gm of the group III source-material gas of TMI and the group V source-material gas of $NH_3$ is supplied toward the substrate 90 from the first gas introduction unit 11 and the second gas introduction unit 21.

The third source-material gas g3 (e.g., $N_2$) from the third gas introduction unit 31 may be used. In such a case as well, the third source-material gas g3 flows toward the substrate 90 as a sub-flow to straighten the flow of the gases.

Thus, the gas mixture gm of TMI and $NH_3$ can be supplied from both the first gas introduction unit 11 and the second gas introduction unit 21. Therefore, it is easy to increase the ratio of $NH_3$ to the entirety. In other words, the occurrence of turbulent flow is suppressed by supplying the gas mixture gm of TMI and $NH_3$ to both the first gas introduction unit 11 and the second gas introduction unit 21 with a flow rate at which turbulent flow does not occur; and the flow rate ratio of $NH_3$ gas to the total flow rate can be increased while maintaining the laminar flow gl. Thereby, the second semiconductor layer having the low Al compositional proportion can be deposited with a high flow rate ratio of $NH_3$ gas; the uniformity in the surface of the composition and film thickness of the second semiconductor layer can be increased; and the reproducibility of the composition and film thickness of the second semiconductor layer can be increased.

Thus, the vapor deposition method according to this embodiment also includes: depositing the first semiconductor layer by supplying the group III source-material gas and the group V source-material gas toward the substrate 90 from mutually different outlets (the first gas introduction unit 11 and the second gas introduction unit 21) (step S110); and depositing the second semiconductor layer by mixing the group III source-material gas and the group V source-material gas and supplying the mixed group III and group V source-material gases toward the substrate from the same outlet (e.g., the first gas introduction unit 11) (step S120). In this embodiment, step S120 mixes the group III source-material gas and the group V source-material gas and further supplies the mixed group III and group V source-material gases toward the substrate 90 from an outlet (the second gas introduction unit 21) different from the outlet of the mixed group III and group V source-material gases recited above.

According to the vapor deposition method according to this embodiment as well, semiconductor layers having different compositions can be formed with high uniformity in the surface and high reproducibility.

Such a vapor deposition method can be implemented using, for example, the vapor deposition apparatus recited below.

Figure 14:
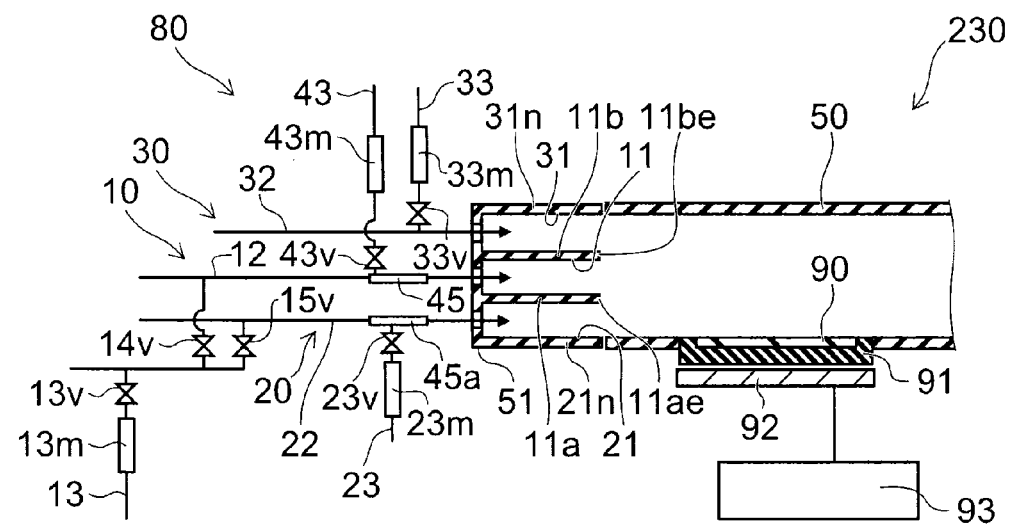
FIG. 14 is a schematic view showing a vapor deposition apparatus.

FIG. 14 is a schematic view illustrating the configuration of a vapor deposition apparatus according to the fifth embodiment of the invention.

In the vapor deposition apparatus 230 according to this embodiment as illustrated in FIG. 14, both the external mixing unit 45 described in regard to FIG. 3 and the external mixing unit 45a described in regard to FIG. 11 are provided.

In other words, mixing units (the external mixing unit 45 and the external mixing unit 45a) are provided in both the first gas supply unit 10 and the second gas supply unit 20.

The first gas supply unit 10 further includes the first pipe 12 introducing one selected from the group III source-material gas and the group V source-material gas. The mixing unit (the external mixing unit 45) is provided between the first pipe 12 and the reaction chamber 50; and a pipe (the second source-material gas pipe 43 for mixing) is connected to the mixing unit (the external mixing unit 45) on the first pipe 12 side to introduce the other one of the group III source-material gas and the group V source-material gas.

The second gas supply unit 20 further includes the second pipe 22 introducing the other one of the group III source-material gas and the group V source-material gas. The mixing unit (the external mixing unit 45a) is provided between the second pipe 22 and the reaction chamber 50. A pipe (the first source-material gas pipe 13) is connected to the mixing unit (the external mixing unit 45a) on the second pipe 22 side to introduce one selected from the group III source-material gas and the group V source-material gas.

Thereby, step S110 and step S120 described in regard to FIG. 13 can be implemented.

Figure 15:
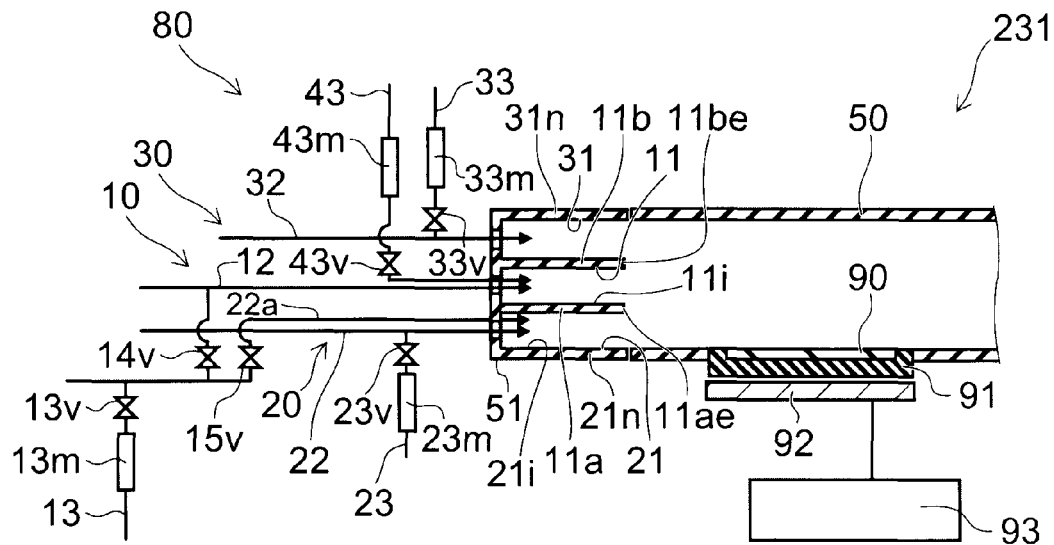
FIG. 15 is a schematic view showing a vapor deposition apparatus.

FIG. 15 is a schematic view illustrating the configuration of another vapor deposition apparatus according to the fifth embodiment of the invention.

In the vapor deposition apparatus 231 according to this embodiment as illustrated in FIG. 15, the first gas supply unit 10 includes the first pipe 12 (the first supply pipe) and the mixing pipe 42 (the second supply pipe) described in regard to FIG. 9; and the second gas supply unit 20 includes the mixing pipe 22a (the third supply pipe) and the second pipe 22 (the fourth supply pipe) described in regard to FIG. 12.

The first gas supply unit 10 includes the first pipe 12 (the first supply pipe) and the mixing pipe 42 (the second supply pipe); the mixing unit (the internal mixing unit 11i) is a portion in the interior of the reaction chamber 50 to which the first supply pipe and the second supply pipe are connected; and the group III source-material gas and the group V source-material gas mix with each other on the first and second supply pipe side of the end portion of the mixing unit (the internal mixing unit 11i), where the end portion is on the substrate 90 side of the mixing unit.

The second gas supply unit 20 includes the mixing pipe 22a (the third supply pipe) and the second pipe 22 (the fourth supply pipe); the mixing unit (the internal mixing unit 21i) is a portion in the interior of the reaction chamber 50 to which the third supply pipe and the fourth supply pipe are connected; and the group III source-material gas and the group V source-material gas mix with each other on the third and fourth supply pipe side of the end portion of the mixing unit (the internal mixing unit 21i), where the end portion is on the substrate 90 side of the mixing unit.

Thereby, step S110 and step S120 described in regard to FIG. 13 can be implemented.

In the vapor deposition apparatuses 220, 221, 230, and 231 recited above as well, the measurement unit 60 and the control unit 70 also may be provided.

However, in the vapor deposition methods and the vapor deposition apparatuses according to the embodiments of the invention, in the case where a horizontal reaction chamber 50 such as those of the vapor deposition apparatuses 210 to 212, 220, 221, 230, and 231 recited above is used, it is desirable to supply the group V source-material gas from the outlet on the side proximal to the substrate 90 (the lower side) and supply the group III source-material gas from the outlet on the side (the upper side) more distal to the substrate 90 than is the lower side outlet when supplying the group III source-material gas and the group V source-material gas from the different outlets. Thereby, the group III source-material gas and the group V source-material gas are supplied in a laminar configuration proximally to the substrate 90 in the state of being moderately separated; and film formation is possible with higher uniformity.

Sixth Embodiment

Although examples are described above in which a horizontal reaction chamber is used, a vertical reaction chamber may be used in this embodiment.

Figure 16:
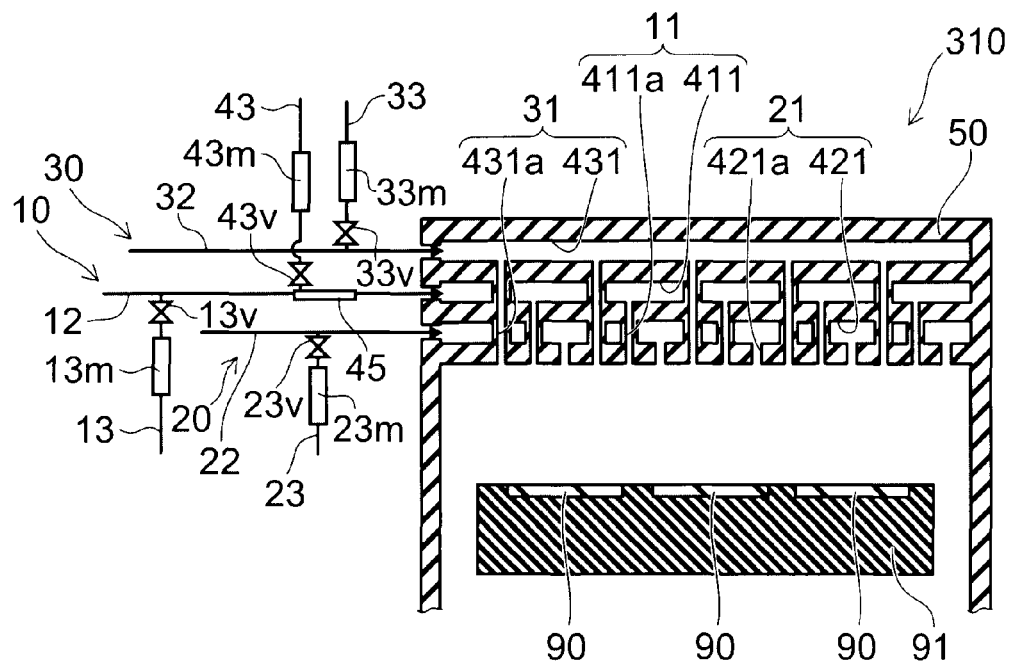
FIG. 16 is a schematic view showing a vapor deposition apparatus.

FIG. 16 is a schematic view illustrating the configuration of a vapor deposition apparatus according to a sixth embodiment of the invention.

As illustrated in FIG. 16, the vapor deposition apparatus 310 according to this embodiment includes the reaction chamber 50 which is a vertical reaction chamber. The first gas introduction unit 11 of the first gas supply unit 10, the second gas introduction unit 21 of the second gas supply unit 20, and the third gas introduction unit 31 of the third gas supply unit 30 extend from the wall portion of the reaction chamber 50 above the susceptor 91 provided in the interior of the reaction chamber 50. The portions of the first gas supply unit 10, the second gas supply unit 20, and the third gas supply unit 30 outside the reaction chamber 50 have the same configurations as those of the vapor deposition apparatus 210.

In this specific example, multiple substrates 90 are placed on the susceptor 91. However, this embodiment is not limited thereto. The design may include one substrate 90 placed on the susceptor 91.

As illustrated in FIG. 16, the second gas introduction unit 21, the first gas introduction unit 11, and the third gas introduction unit 31 are disposed above the susceptor 91 in this order from bottom to top.

The second gas introduction unit 21 includes a second horizontally aligned portion 421 aligned in the horizontal direction (the direction parallel to the major surface of the susceptor 91) above the susceptor 91 and a second vertically aligned portion 421a aligned downward from the second horizontally aligned portion 421. The second vertically aligned portion 421a is multiply provided. Thereby, the gas introduced through the second pipe 22 into the reaction chamber 50 is introduced through the second horizontally aligned portion 421 and the second vertically aligned portion 421a onto the substrate 90 placed on the susceptor 91.

The first gas introduction unit 11 includes a first horizontally aligned portion 411 aligned in the horizontal direction above the susceptor 91 and a first vertically aligned portion 411a aligned downward from the first horizontally aligned portion 411. The first vertically aligned portion 411a is multiply provided. Thereby, the gas introduced through the first pipe 12 into the reaction chamber 50 is introduced through the first horizontally aligned portion 411 and the first vertically aligned portion 411a onto the substrate 90 placed on the susceptor 91.

In such a case, the first horizontally aligned portion 411 is separated from the second horizontally aligned portion 421 by a baffle. Although the first vertically aligned portion 411a is aligned downward to pierce the second horizontally aligned portion 421, the first vertically aligned portion 411a is separated from the second horizontally aligned portion 421 by a baffle. The position of the first vertically aligned portion 411a in the horizontal direction is different from the position of the second vertically aligned portion 421a in the horizontal direction. According to such a configuration, the gas introduced through the first horizontally aligned portion 411 and the first vertically aligned portion 411a and the gas introduced through the second horizontally aligned portion 421 and the second vertically aligned portion 421a pass through mutually separate paths and are supplied above the substrate 90 without mixing with each other.

The third gas introduction unit 31 includes a third horizontally aligned portion 431 aligned in the horizontal direction above the susceptor 91 and a third vertically aligned portion 431a aligned downward from the third horizontally aligned portion 431. The third vertically aligned portion 431a is multiply provided. Thereby, the gas introduced through the third pipe 32 into the reaction chamber 50 is introduced through the third horizontally aligned portion 431 and the third vertically aligned portion 431a onto the substrate 90 placed on the susceptor 91.

The third horizontally aligned portion 431 is separated from the first horizontally aligned portion 411 by a baffle.

Although the third vertically aligned portion 431a is aligned downward to pierce the first horizontally aligned portion 411 and the second horizontally aligned portion 421, the third vertically aligned portion 431a is separated from the first horizontally aligned portion 411 and the second horizontally aligned portion 421 by a baffle. The position of the third vertically aligned portion 431a in the horizontal direction is different from the positions of the first vertically aligned portion 411a and the second vertically aligned portion 421a in the horizontal direction. According to such a configuration, the gas introduced through the first horizontally aligned portion 411 and the first vertically aligned portion 411a, the gas introduced through the second horizontally aligned portion 421 and the second vertically aligned portion 421a, and the gas introduced through the third horizontally aligned portion 431 and the third vertically aligned portion 431a pass through mutually separate paths and are supplied above the substrate 90 without mixing with each other.

Thus, in this specific example as well, the first gas supply unit 10, the second gas supply unit 20, and the third gas supply unit 30 are separated from each other.

By supplying the first source-material gas g1, the second source-material gas g2, and the third source-material gas g3 described above toward the substrate 90 from the first gas supply unit 10, the second gas supply unit 20, and the third gas supply unit 30, the depositing of the first semiconductor layer (step S110) and the depositing of the second semiconductor layer (step S120) are implemented. In such a case as well, the first semiconductor layer is deposited by supplying the group III source-material gas and the group V source-material gas toward the substrate 90 from mutually different outlets (e.g., the first gas introduction unit 11 and the second gas introduction unit 21). The second semiconductor layer is deposited by mixing the group III source-material gas and the group V source-material gas and supplying the mixed group III and group V source-material gases toward the substrate 90 from the same outlet (e.g., the first gas introduction unit 11).

When depositing the second semiconductor layer, one selected from the group III source-material gas and the group V source-material gas further can be supplied toward the substrate from an outlet (e.g., the second gas introduction unit 21) different from the outlet of the mixed group III and group V source-material gases recited above (e.g., the first gas introduction unit 11).

When depositing the second semiconductor layer as described in regard to FIG. 13, the group III source-material gas and the group V source-material gas further can be mixed and supplied toward the substrate 90 from the outlet (the second gas introduction unit 21) different from the outlet of the mixed group III and group V source-material gases recited above (e.g., the first gas introduction unit 11).

In other words, the configurations of the portions outside the reaction chamber 50 of the vapor deposition apparatuses 212, 220, 221, 230, and 231 described above can be applied to the portions outside the reaction chamber 50 in the vapor deposition apparatus 310 according to this embodiment. Thereby, any of the operations described in regard to FIG. 4, FIG. 10, and FIG. 13 can be implemented.

Moreover, the measurement unit 60 and the control unit 70 may be further provided in the vapor deposition apparatus 310 and vapor deposition apparatuses in which the configurations of the portions outside the reaction chamber 50 of the vapor deposition apparatuses 212, 220, 221, 230, and 231 are applied to the vapor deposition apparatus 310.

Although the case is described above where the first source-material gas is the group III source-material gas and the second source-material gas is the group V source-material gas, the first source-material gas may be the group V source-material gas and the second source-material gas may be the group III source-material gas. In other words, it is sufficient for the first semiconductor layer including a nitride semiconductor having a compositional proportion of Al in group III elements of not less than 10 atomic percent to be deposited by supplying the group III source-material gas and the group V source-material gas toward the substrate 90 from mutually different outlets and for the second semiconductor layer including a nitride semiconductor having a compositional proportion of Al in group III elements of less than 10 atomic percent to be deposited by mixing the group III source-material gas and the group V source-material gas and supplying the mixed group III and group V source-material gases toward the substrate 90 from the same outlet.

According to the embodiments, a vapor deposition method and a vapor deposition apparatus are provided in which semiconductor layers having different compositions can be formed with high uniformity in the surface and high reproducibility.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

Hereinabove, exemplary embodiments of the invention are described with reference to specific examples. However, the invention is not limited to these specific examples. For example, one skilled in the art may similarly practice the invention by appropriate selections from known art, including various modifications made by one skilled in the art in regard to configurations, sizes, material qualities, arrangements, and the like of specific configurations of components included in vapor deposition apparatuses. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all vapor deposition methods and vapor deposition apparatuses practicable by an appropriate design modification by one skilled in the art based on the vapor deposition methods and the vapor deposition apparatuses described above as embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A vapor deposition method for forming a nitride semiconductor crystal layer on a substrate disposed in a reaction chamber by supplying a group III source-material gas and a group V source-material gas into the reaction chamber from a plurality of outlets, the method comprising:
    growing a first semiconductor crystal layer comprising a nitride semiconductor having a compositional proportion of Al in group III elements of not less than 10 atomic percent by supplying a first gas flow comprising the group III source-material gas toward the substrate from a first outlet and by supplying a second gas flow comprising the group V source-material gas toward the substrate from a second outlet different from the first outlet, a direction of the second gas flow being parallel to a direction of the first gas flow; and
    growing a second semiconductor crystal layer comprising a nitride semiconductor having a compositional proportion of Al in group III elements of less than 10 atomic percent by mixing the group III source-material gas and the group V source-material gas and supplying a third gas flow comprising the mixed group III and group V source-material gases toward the substrate from at least one of the first outlet and the second outlet.

2. The method according to claim 1, wherein the growing the second semiconductor crystal layer further comprises supplying a fourth gas flow comprising one selected from the group III source-material gas and the group V source-material gas toward the substrate from at least one of the second outlet and a third outlet different from the first outlet and the second outlet, when the mixed group III and group V source-material gases are supplied from the first outlet in the growing the second semiconductor crystal layer, and a direction of the fourth gas flow is parallel to a direction of the third gas flow.

3. The method according to claim 1, wherein the growing the second semiconductor crystal layer further comprises supplying a fourth gas flow comprising one selected from the group III source-material gas and the group V source-material gas toward the substrate from at least one of the first outlet and a third outlet different from the first outlet and the second outlet, when the mixed group III and group V source-material gases are supplied from the second outlet in the growing the second semiconductor crystal layer, and a direction of the fourth gas flow is parallel to a direction of the third gas flow.

4. The method according to claim 1, wherein the group III source-material gas comprises at least one selected from the group consisting of trimethylaluminium, triethylaluminum, dimethylaluminum hydride, dimethyl-ethylamine alane, tri-isobutylaluminum, trimethylindium, and triethylindium, and
    the group V source-material gas comprises at least one selected from the group consisting of ammonia, monomethylhydrazine, and dimethylhydrazine.

5. The method according to claim 1, wherein the growing the second semiconductor crystal layer comprises:
    measuring an optical characteristic of a surface of the substrate in the growing the second semiconductor crystal layer; and
    controlling a mixing ratio of the group III source-material gas and the group V source-material gas based on at least one selected from a temperature of the substrate, a growth rate of the second semiconductor layer, and a composition of the second semiconductor crystal layer derived from a measurement result of the optical characteristic.

6. The method according to claim 1, wherein the growing the first semiconductor crystal layer comprises supplying a gas including at least one of bis cyclopentadienyl magnesium (Cp$_2$Mg) and bis methyl-cyclopentadienyl magnesium (M$_2$Cp$_2$Mg) toward the substrate.

7. The method according to claim 1, wherein the direction of the first gas flow and the direction of the second gas flow are parallel to a surface of the substrate.

8. The method according to claim 1, wherein the first gas flow and the second gas flow are laminar flows.

9. A vapor deposition method for forming a nitride semiconductor crystal layer on a substrate disposed in a reaction chamber by supplying a group III source-material gas and a group V source-material gas into the reaction chamber from a plurality of outlets, the method comprising:
   growing a first semiconductor crystal layer comprising a nitride semiconductor having a compositional proportion of Al in group III elements of not less than 10 atomic percent by supplying a first gas flow comprising the group III source-material gas toward the substrate from a first outlet and by supplying a second gas flow comprising the group V source-material gas toward the substrate from a second outlet different from the first outlet, a direction of the second gas flow being parallel to a direction of the first gas flow; and
   growing a second semiconductor crystal layer comprising a nitride semiconductor having a compositional proportion of Al in group III elements of less than 10 atomic percent by mixing the group III source-material gas and the group V source-material gas and supplying a third gas flow comprising the mixed group III and group V source-material gases toward the substrate from at least one of the first outlet, the second outlet and a third outlet different from the first outlet and the second outlet.

10. The method according to claim 9, wherein the growing the second semiconductor crystal layer further comprises supplying a fourth gas flow comprising one selected from the group III source-material gas and the group V source-material gas toward the substrate from at least one of the second outlet and the third outlet, when the mixed group III and group V source-material gases are supplied from the first outlet in the growing the second semiconductor crystal layer, and a direction of the fourth gas flow is parallel to a direction of the third gas flow.

11. The method according to claim 9, wherein the growing the second semiconductor crystal layer further comprises supplying a fourth gas flow comprising one selected from the group III source-material gas and the group V source-material gas toward the substrate from at least one of the first outlet and the third outlet, when the mixed group III and group V source-material gases are supplied from the second outlet in the growing the second semiconductor crystal layer, and a direction of the fourth gas flow is parallel to a direction of the third gas flow.

12. The method according to claim 9, wherein the growing the second semiconductor crystal layer further comprises supplying a fourth gas flow comprising one selected from the group III source-material gas and the group V source-material gas toward the substrate from at least one of the first outlet, the second outlet and a fourth outlet different from the first outlet, the second outlet and third outlet, when the mixed group III and group V source-material gases are supplied from the third outlet in the growing the second semiconductor crystal layer, and a direction of the fourth gas flow is parallel to a direction of the third gas flow.

13. The method according to claim 9, wherein
   the group III source-material gas comprises at least one selected from the group consisting of trimethylaluminium, triethylaluminum, dimethylaluminum hydride, dimethyl-ethylamine alane, triisobutylaluminum, trimethylindium, and triethylindium, and
   the group V source-material gas comprises at least one selected from the group consisting of ammonia, monomethylhydrazine, and dimethylhydrazine.

14. The method according to claim 9, wherein the growing the second semiconductor crystal layer comprises:
   measuring an optical characteristic of a surface of the substrate in the depositing the second semiconductor crystal layer; and
   controlling a mixing ratio of the group III source-material gas and the group V source-material gas based on at least one selected from a temperature of the substrate, a growth rate of the second semiconductor layer, and a composition of the second semiconductor crystal layer derived from a measurement result of the optical characteristic.

15. The method according to claim 9, wherein the direction of the first gas flow and the direction of the second gas flow are parallel to a surface of the substrate.

16. The method according to claim 9, wherein the first gas flow and the second gas flow are laminar flows.

\* \* \* \* \*